United States Patent
Yang et al.

(10) Patent No.: US 9,466,601 B2
(45) Date of Patent: Oct. 11, 2016

(54) SEMICONDUCTOR DEVICE AND METHOD OF FABRICATING THE SAME

(71) Applicant: Samsung Electronics Co., Ltd., Suwon-si (KR)

(72) Inventors: Junggil Yang, Suwon-si (KR); Sangsu Kim, Yongin-si (KR); TaeYong Kwon, Suwon-Si (KR); Sung Gi Hur, Hwaseong-si (KR)

(73) Assignee: SAMSUNG ELECTRONICS CO., LTD., Samsung-ro, Yeongtong-gu, Suwon-si Gyeonggi-do (KR)

(*) Notice: Subject to any disclaimer, the term of this patent is extended or adjusted under 35 U.S.C. 154(b) by 138 days.

(21) Appl. No.: 14/274,861

(22) Filed: May 12, 2014

(65) Prior Publication Data
US 2015/0041899 A1    Feb. 12, 2015

(30) Foreign Application Priority Data

Aug. 12, 2013 (KR) .......... 10-2013-0095490

(51) Int. Cl.
*H01L 27/092* (2006.01)
*H01L 21/8238* (2006.01)

(52) U.S. Cl.
CPC ... *H01L 27/0924* (2013.01); *H01L 21/823807* (2013.01); *H01L 21/823821* (2013.01); *H01L 27/0922* (2013.01)

(58) Field of Classification Search
CPC .................................................. H01L 27/0922
See application file for complete search history.

(56) References Cited

U.S. PATENT DOCUMENTS

| | | | |
|---|---|---|---|
| 7,250,658 B2 | 7/2007 | Doris et al. | |
| 7,737,532 B2 | 6/2010 | Ke et al. | |
| 7,781,290 B2 | 8/2010 | Lee et al. | |
| 8,183,104 B2 | 5/2012 | Hobbs et al. | |
| 8,203,148 B2 | 6/2012 | Sekar et al. | |
| 2007/0267693 A1* | 11/2007 | Chien | H01L 21/823892 257/343 |
| 2009/0090934 A1* | 4/2009 | Tezuka | H01L 27/1211 257/190 |
| 2009/0170251 A1* | 7/2009 | Jin | B82Y 10/00 438/197 |
| 2009/0289304 A1 | 11/2009 | Pouydebasque et al. | |
| 2010/0187503 A1* | 7/2010 | Moriyama | B82Y 10/00 257/24 |
| 2012/0319178 A1* | 12/2012 | Chang | B82Y 10/00 257/287 |
| 2014/0329388 A1* | 11/2014 | Jang | H01L 21/28141 438/702 |

FOREIGN PATENT DOCUMENTS

| | | |
|---|---|---|
| KR | 10-2004-0091309 A | 10/2004 |
| KR | 10-2007-0006441 A | 1/2007 |
| KR | 10-2008-0092603 A | 10/2008 |

* cited by examiner

*Primary Examiner* — Peniel M Gumedzoe
*Assistant Examiner* — Christopher Johnson
(74) *Attorney, Agent, or Firm* — Muir Patent Law, PLLC

(57) ABSTRACT

A semiconductor device includes a substrate including first and second regions, a first transistor provided on the first region to include a first channel region protruding from the substrate, and a second transistor provided on the second region to include a second channel region and a gate electrode extending between the substrate and the second channel region. The first channel region may include a lower semiconductor pattern containing a different material from the second channel region and an upper semiconductor pattern containing the same material as the second channel region.

17 Claims, 35 Drawing Sheets

800

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0095490, filed on Aug. 12, 2013, in the Korean Intellectual Property Office, the entire contents of which are hereby incorporated by reference.

BACKGROUND OF THE INVENTION

This disclosure relates to a semiconductor device and a method of fabricating the same, and in particular, to a semiconductor device with a field effect transistor and a method of fabricating the same.

Semiconductor integrated circuit devices are increasingly being used in consumer, commercial, and other electronic devices. The semiconductor devices may be classified into memory devices for storing data, logic devices for processing data, and hybrid devices including both of memory and logic elements. Due to the increased demand for electronic devices with fast speed and/or low power consumption, these semiconductor devices are often needed to provide high reliability, high performance, and/or multiple functions. To satisfy these technical requirements, complexity and/or integration density of semiconductor devices are being increased. However, as the integration density increases, a semiconductor device may be affected in different ways. For example, leakage currents, as well as a short channel effect may occur in field effect transistor devices as they decrease in size.

SUMMARY

Example embodiments provide a method of easily and simultaneously forming a fin field effect transistor (FET) and a gate-all-around FET.

Other example embodiments provide a semiconductor device including a high-voltage region, on which a fin-FET configured to realize a body contact is provided, and a low-voltage region, on which a gate-all-around field effect transistor configured to suppress a narrow channel effect is provided.

Still other example embodiments provide a semiconductor device including a PMOSFET region with a fin-FET, whose channel is parallel to a first plane, and an NMOSFET region with a gate-all-around FET, whose channel is parallel to a second plane.

According to one example embodiment, a semiconductor device includes: a substrate including a first region and a second region; a first transistor in the first region and including a first channel region formed of an upper semiconductor layer formed on a lower semiconductor layer, the first channel region being a fin structure contacting the substrate and protruding therefrom; a second transistor in the second region and including a second channel region formed of the upper semiconductor layer, the second channel region having a gate-all-around structure; a first gate electrode of the first transistor, the first gate electrode covering the fin structure; and a second gate electrode of the second transistor, the second gate electrode formed around the second channel region, such that the second gate electrode covers the second channel region from above, below, and on both sides. The lower semiconductor layer is formed of a different material from the upper semiconductor layer.

The lower semiconductor pattern may comprise a material having an etch selectivity with respect to the upper semiconductor layer.

In one embodiment, the second channel region has a bottom surface that is substantially coplanar with an interface between the upper and lower semiconductor layers.

Also, the first gate structure may have a top surface that is substantially coplanar with a top surface of the second gate structure.

In one embodiment, a first gate dielectric layer covers surfaces of the fin structure and is formed between the fin structure and the first gate electrode, and a second gate dielectric layer covers surfaces of the second channel region and is formed between the second channel region and the second gate electrode.

The semiconductor device may additionally includes first source/drain regions that are spaced apart from each other by the first channel region, each first source/drain region including the lower semiconductor layer and the upper semiconductor layer; and second source/drain regions that are spaced apart from each other by the second channel region, each second source/drain region including the lower semiconductor layer and the upper semiconductor layer.

In one embodiment, the first and second gate electrodes are part of a single continuous gate electrode that crosses both the first channel region and the second channel region.

According to one example embodiment, a semiconductor device includes a substrate including a first region and a second region, a first transistor provided on the first region to include a first channel region protruding from the substrate, and a second transistor provided on the second region to include a second channel region and a gate electrode extending between the substrate and the second channel region. The first channel region may include a lower semiconductor pattern containing a different material from the second channel region and an upper semiconductor pattern containing the same material as the second channel region.

In example embodiments, the lower semiconductor pattern may include a material having an etch selectivity with respect to the upper semiconductor pattern.

In example embodiments, the second channel region has a bottom surface that is substantially coplanar with an interface between the upper and lower semiconductor patterns.

In example embodiments, the first transistor may be a PMOS transistor and the second transistor may be an NMOS transistor.

In example embodiments, the first channel region has a side surface of a first plane, and the second channel region has top and bottom surfaces of second plane.

In example embodiments, the first transistor is a high-voltage transistor having an operation voltage of 1V or higher, and the second transistor is a low-voltage transistor having an operation voltage that is smaller than 1V.

In example embodiments, the lower semiconductor pattern is in contact with a top surface of the substrate.

In example embodiments, the lower semiconductor pattern is part of a plurality of lower semiconductor patterns, the upper semiconductor pattern is part of a plurality of upper semiconductor patterns, and the lower semiconductor patterns and the upper semiconductor patterns are alternatingly and repeatedly stacked on top of each other.

In example embodiments, the second channel region includes a plurality of second channel regions, each of which is coplanar with a corresponding one of the upper semiconductor patterns.

In example embodiments, the lower semiconductor pattern may be thicker than the upper semiconductor pattern.

In example embodiments, the lower semiconductor pattern at the first transistor has a width smaller than that of the upper semiconductor pattern.

In example embodiments, the second transistor includes a source region and a drain region that are be spaced apart from each other by the second channel region, and lower portions of the source and drain regions include the same material as the lower semiconductor pattern.

In example embodiments, the semiconductor device includes an input/output circuit and a logic circuit, and the first transistor is part of the input/output circuit of the semiconductor device and the second transistor is part of the logic circuit of the semiconductor device.

According to another example embodiment, a semiconductor device includes a semiconductor layer, a first transistor including a first channel structure protruding from the semiconductor layer, and a second transistor including a gate electrode and a second channel structure that is spaced apart from the semiconductor layer by the gate electrode. The first channel structure contacts the semiconductor layer.

In example embodiments, the first channel structure includes a lower semiconductor pattern and an upper semiconductor pattern thereon, and the lower semiconductor pattern includes a material having an etch selectivity with respect to the upper semiconductor pattern.

In example embodiments, the lower semiconductor pattern is part of a plurality of lower semiconductor patterns, the upper semiconductor pattern is part of a plurality of upper semiconductor patterns, and the lower semiconductor patterns and the upper semiconductor patterns are alternatingly and repeatedly stacked on top of each other.

In example embodiments, the second channel structure is part of a plurality of second channel structures, each of which is coplanar with a corresponding one of the upper semiconductor patterns.

In example embodiments, the lower semiconductor pattern is thicker than the upper semiconductor pattern.

In example embodiments, the lower semiconductor pattern has a width smaller than that of the upper semiconductor pattern at the first transistor.

In example embodiments, the second transistor includes a source region and a drain region that are spaced apart from each other by the second channel structure, and lower portions of the source and drain regions include the same material as the lower semiconductor pattern.

In example embodiments, the first transistor may be a PMOS transistor and the second transistor may be an NMOS transistor.

In example embodiments, the first channel structure has a side surface of (110) plane, and the second channel structure has top and bottom surfaces of (100) plane.

In example embodiments, the first transistor is a high-voltage transistor having an operation voltage of 1V or higher, and the second transistor is a low-voltage transistor having an operation voltage that may be smaller than 1V.

In example embodiments, the second channel structure has a width between 5 and 30 nm.

According to a further example embodiment, a method of fabricating a semiconductor device may include preparing a substrate including a first region and a second region, sequentially forming a first semiconductor layer and a second semiconductor layer on the first and second regions, patterning the first and second semiconductor layers to form a lower semiconductor pattern and an upper semiconductor pattern on each of the first and second regions, selectively removing the lower semiconductor pattern on the second region to form a gap region, and forming gate electrodes at the first and second regions, respectively.

In example embodiments, the first and second semiconductor layers are formed by an epitaxial process using the substrate as a seed layer.

In example embodiments, the gate electrode at the second region is formed to extend into the gap region.

In example embodiments, the forming of the gap region may further include a mask pattern covering the first region.

In example embodiments, the method may further include performing a surface treatment process, after the forming of the gap region, in such a way that the upper semiconductor pattern on the second region has a rounded surface.

In example embodiments, the forming of the first and second semiconductor layers includes forming alternatingly and repeatedly a plurality of first semiconductor layers and a plurality of second semiconductor layers.

In example embodiments, the gap region may be part of a plurality of gap regions, each of which may be formed between a corresponding pair of second semiconductor patterns formed by pattering the second semiconductor layers at the second region.

In example embodiments, a width of the upper semiconductor pattern is greater at the first region than at the second region, and the lower semiconductor pattern at the first region is partially removed during the forming of the gap region, thereby having a width smaller than the upper semiconductor pattern at the first region.

In example embodiments, the method may further include forming an interlayered insulating layer covering sidewalls of both end portions of the lower semiconductor pattern at the second region. The forming of the gap region may be performed to remain both end portions of the lower semiconductor pattern on the second region.

In example embodiments, the first semiconductor layer may be formed thicker than the second semiconductor layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
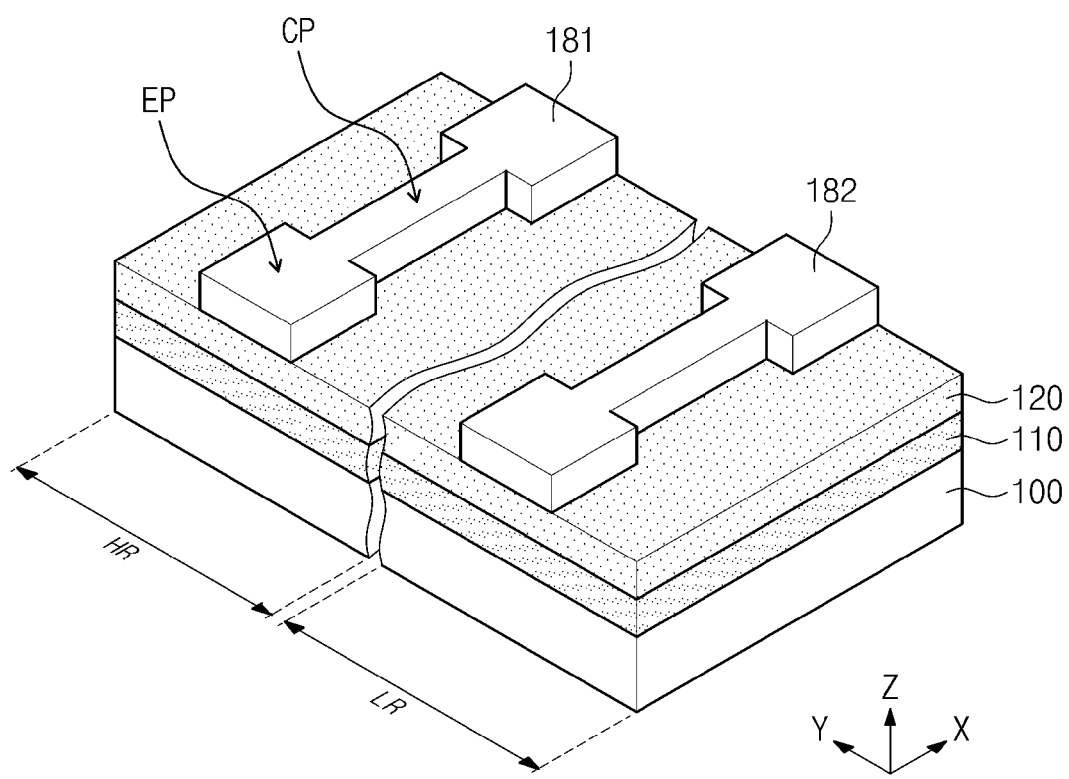
FIGS. 1 through 7 are perspective views illustrating a method of fabricating a semiconductor device, according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantial" may be used herein to convey this meaning.

The term "contact" as used herein refers to direct contact, unless indicated otherwise.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 5:
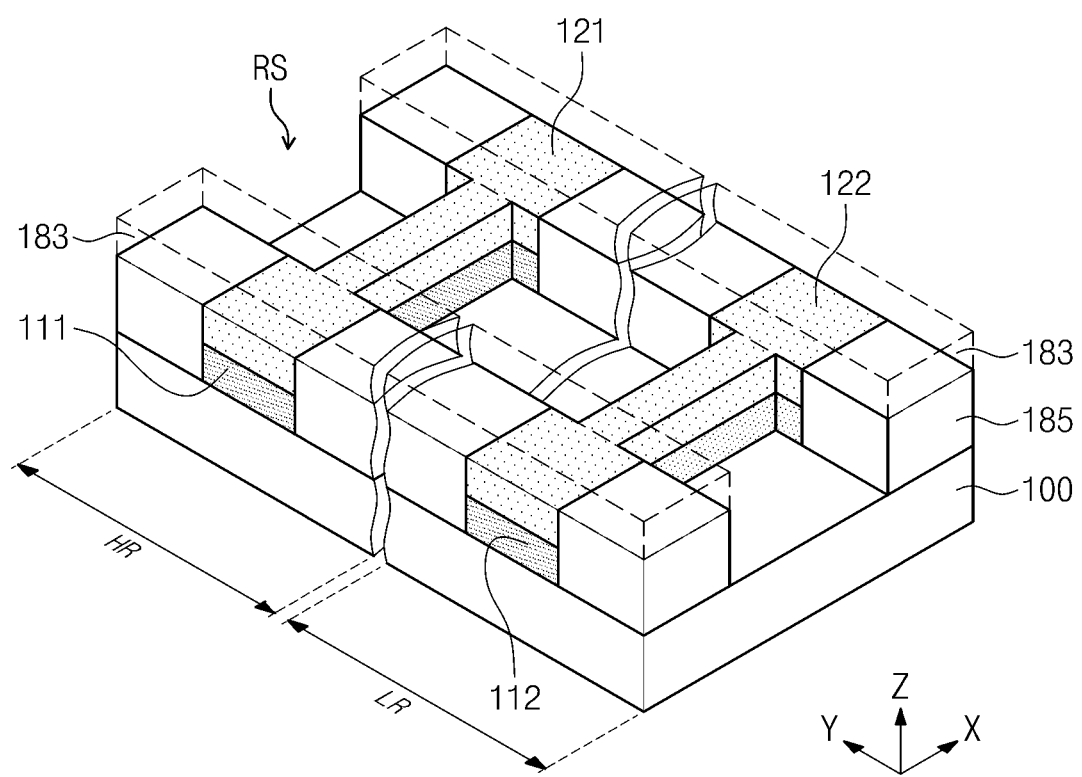
Figure 6:
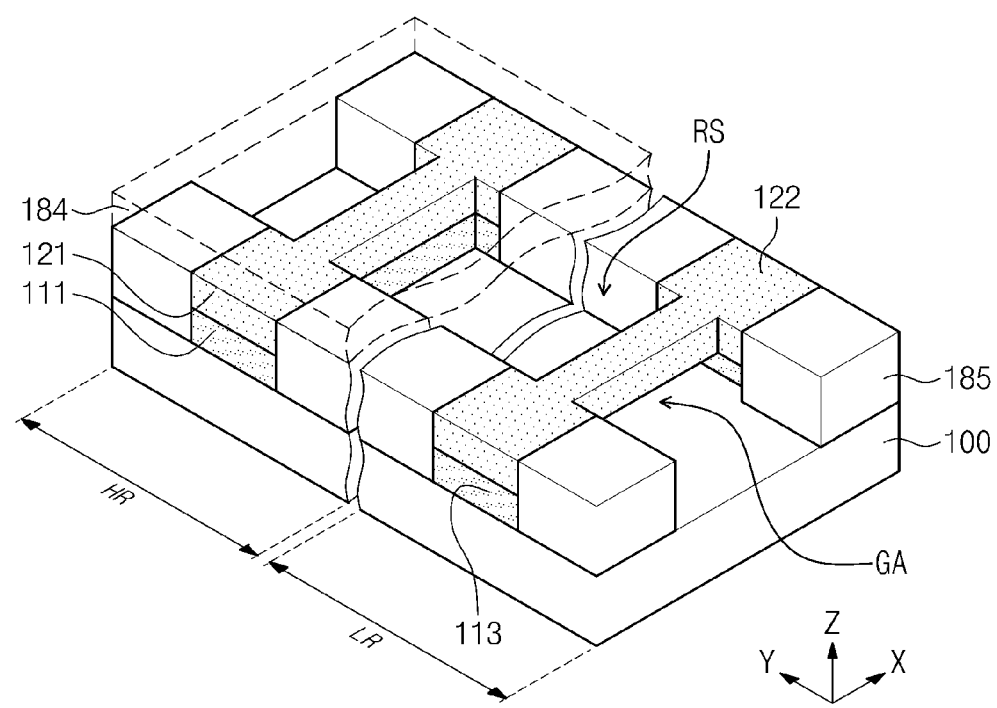
Figure 7:
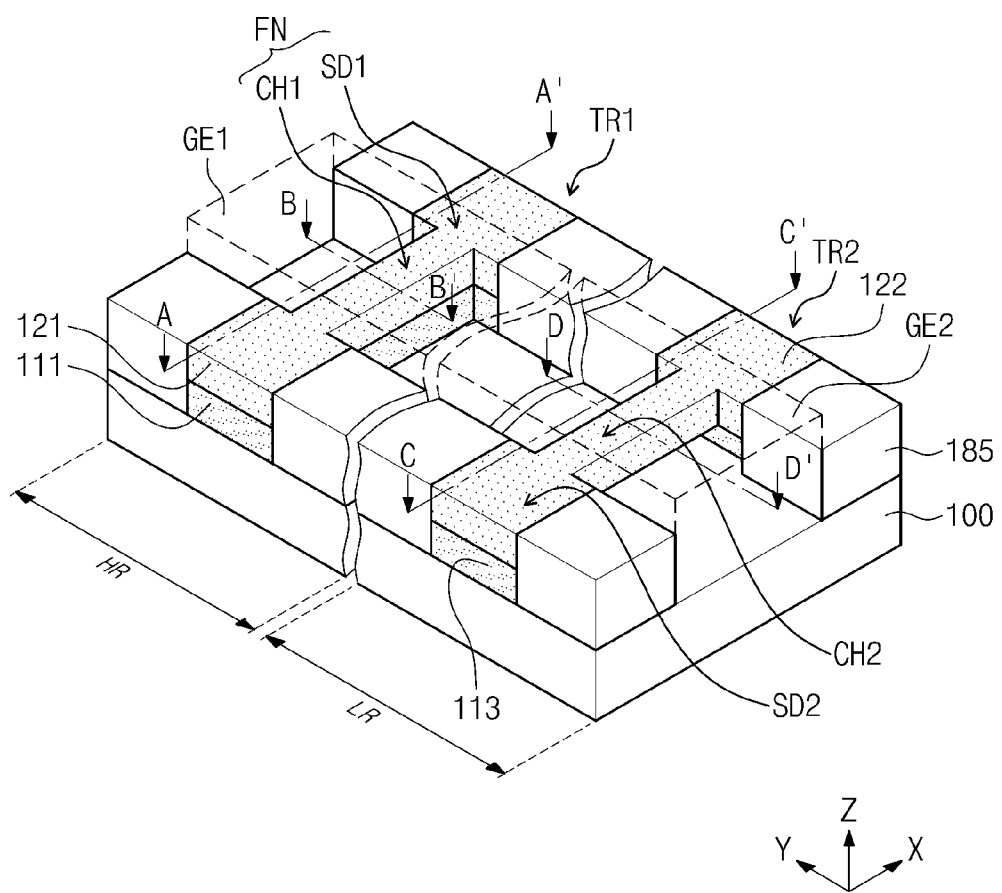
Figure 8A:
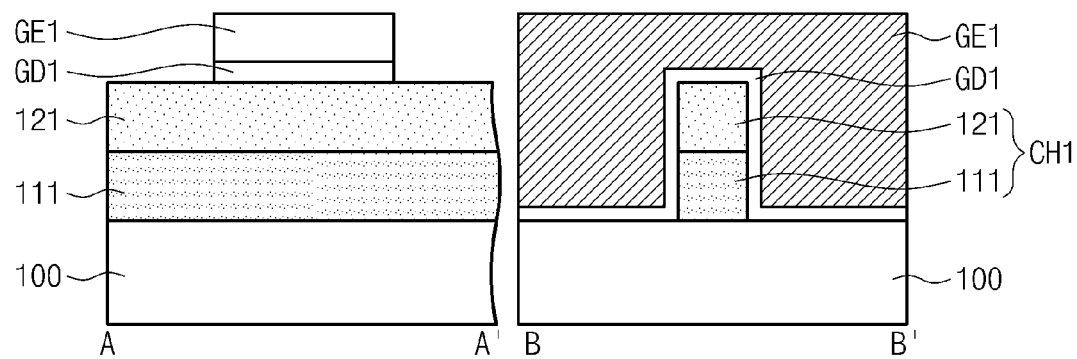
FIG. 8A is an exemplary sectional view taken along lines A-A' and B-B' of FIG. 7.
Figure 8B:
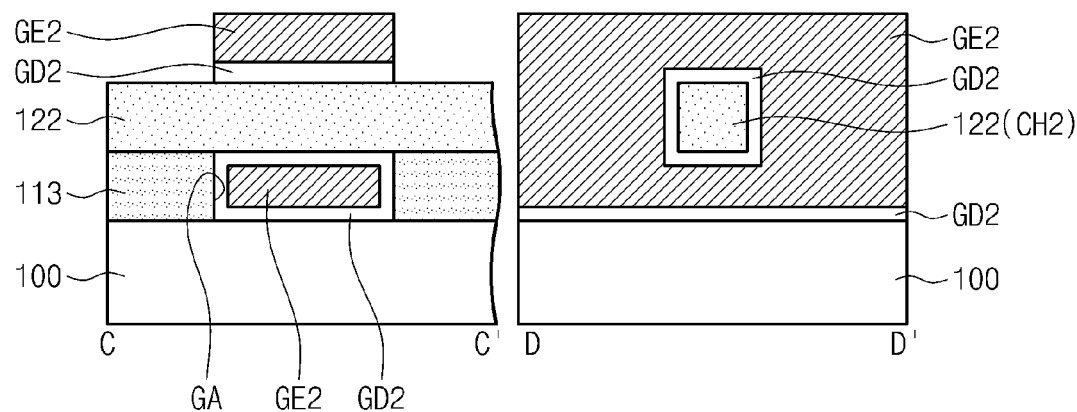
FIG. 8B is an exemplary sectional view taken along lines C-C' and D-D' of FIG. 7.

FIGS. 1 through 7 are perspective views illustrating a method of fabricating a semiconductor device, according to example embodiments. FIG. 8A is an exemplary sectional view taken along lines A-A' and B-B' of FIG. 7, and FIG. 8B is an exemplary sectional view taken along lines C-C' and D-D' of FIG. 7.

Referring to FIG. 1, a first semiconductor layer 110 and a second semiconductor layer 120 may be sequentially formed on a substrate 100. The substrate 100 may include a first region and a second region. In the present embodiment, the first region may be, for example, a high-voltage region HR, on which high-voltage transistors applied with a relatively high operation voltage are integrated, and the second region may be a low-voltage region LR, on which low-voltage transistors applied with a relatively low operation voltage are integrated. In the specification, the high-voltage transistors may refer to a transistor having an operation voltage, for example, of 1V or higher, while the low-voltage transistor may refer to a transistor having an operation voltage, for example, of 1V or less. The substrate 100 may be a semiconductor wafer containing, for example, silicon, germanium, or silicon-germanium.

The first semiconductor layer 110 may include a material having an etch selectivity with respect to the second semiconductor layer 120. For example, when the first semiconductor layer 110 is etched using a predetermined etch recipe, the first semiconductor layer 110 may be formed of a material that can be selectively etched, while preventing the second semiconductor layer 120 from being etched. The etch selectivity may be quantitatively expressed in terms of a ratio of an etch rate of the first semiconductor layer 110 to an etch rate of the second semiconductor layer 120. In example embodiments, the first semiconductor layer 110 may be one of materials having an etch selectivity ranging from 10:1 to 200:1, with respect to the second semiconductor layer 120. In other words, the etch rate of the first semiconductor layer 110 is faster than the etch rate of the second semiconductor layer 120. For example, materials, which are described in one of examples 1-11 in the following table 1, may be used for the first and second semiconductor layers 110 and 120.

TABLE 1

| | First Semiconductor Layer | Second Semiconductor Layer |
|---|---|---|
| Example 1 | SiGe | Si |
| Example 2 | SiGe | Ge |
| Example 3 | GeSn | Ge |
| Example 4 | InP | InGaAs |
| Example 5 | InP | InAs |
| Example 6 | InAlAs | InGaAs |
| Example 7 | InAlAs | InAs |
| Example 8 | InGaP | InGaAs |
| Example 9 | InGaP | InAs |
| Example 10 | InAs | InGaSb |
| Example 11 | InAs | InSb |

The first and second semiconductor layers 110 and 120 may be formed, for example, by an epitaxial growth process using the substrate 100 as a seed layer. For example, the epitaxial growth process may be performed by a chemical vapor deposition (CVD) process or a molecular beam epitaxy (MBE) process. The first and second semiconductor layers 110 and 120 may be continuously formed in the same chamber. In example embodiments, the first and second semiconductor layers 110 and 120 are grown to cover conformally a whole top surface of the substrate 100. For example, the first and second semiconductor layers 110 and 120 may not be selectively grown from a portion of the substrate 100.

In the present embodiment, the first and second semiconductor layers 110 and 120 are formed to have substantially the same thickness as each other (e.g., in the z direction), but example embodiments are not limited thereto.

First mask patterns 181 and 182 may be formed on the second semiconductor layer 120. In order to reduce complexity in the drawings and to provide better understanding of example embodiments, the first mask patterns 181 and 182 are illustrated to have the same shape on the high- and low-voltage regions HR and LR, but example embodiments are not limited thereto. The first mask patterns 181 and 182 may be formed in such a way that both end portions EP thereof have a larger width (e.g., in the y direction) than that of a center portion CP disposed therebetween. The first mask patterns 181 and 182 may have, for example, barbell shapes, or "I" shapes. As such, the end portions EP may be disposed spaced apart from each other in an x direction, along a length of the center portion CP. The first mask patterns 181 and 182 may include, for example, at least one of photoresist, silicon nitride, silicon oxide, or silicon oxynitride. The first mask patterns 181 and 182 may be formed, for example, using a CVD process.

Figure 2:
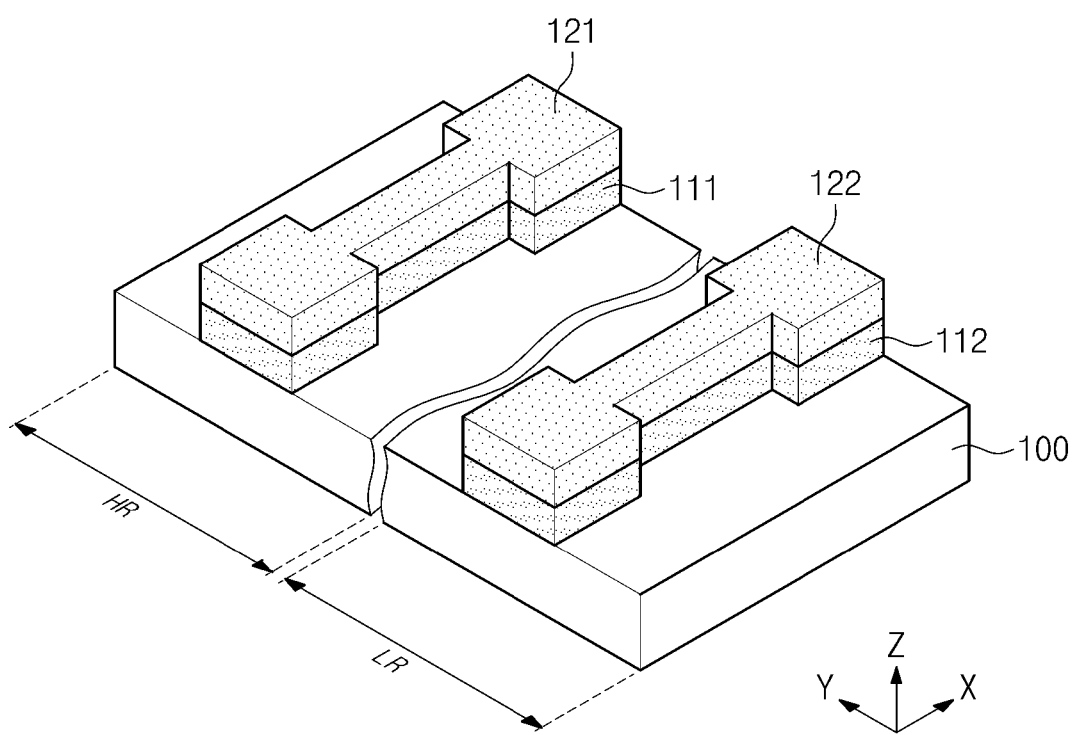

Referring to FIG. 2, a patterning process is performed using the first mask patterns 181 and 182 as an etch mask. Accordingly, a first lower semiconductor pattern 111 and a first upper semiconductor pattern 121 may be sequentially stacked on the high-voltage region HR, and a second lower semiconductor pattern 112 and a second upper semiconductor pattern 122 may be sequentially stacked on the low-voltage region LR. Since the first mask pattern 181 on the high-voltage region HR is used as the etch mask, the first lower and upper semiconductor patterns 111 and 121 may be formed in such a way that both end portions thereof have a larger width than that of a center portion thereof. Similarly, since the first mask pattern 182 on the low-voltage region LR is used as the etch mask, the second lower and upper semiconductor patterns 112 and 122 may be formed in such a way that both end portions thereof have a larger width than that of a center portion thereof. The patterning process may include, for example, a dry and/or wet etching process. For example, the patterning process may be performed using an anisotropic dry etching process. After the patterning process, the first mask patterns 181 and 182 may be removed. For example, the removal of the first mask patterns 181 and 182 may be performed using an ashing process and/or a wet etching process.

Figure 3:
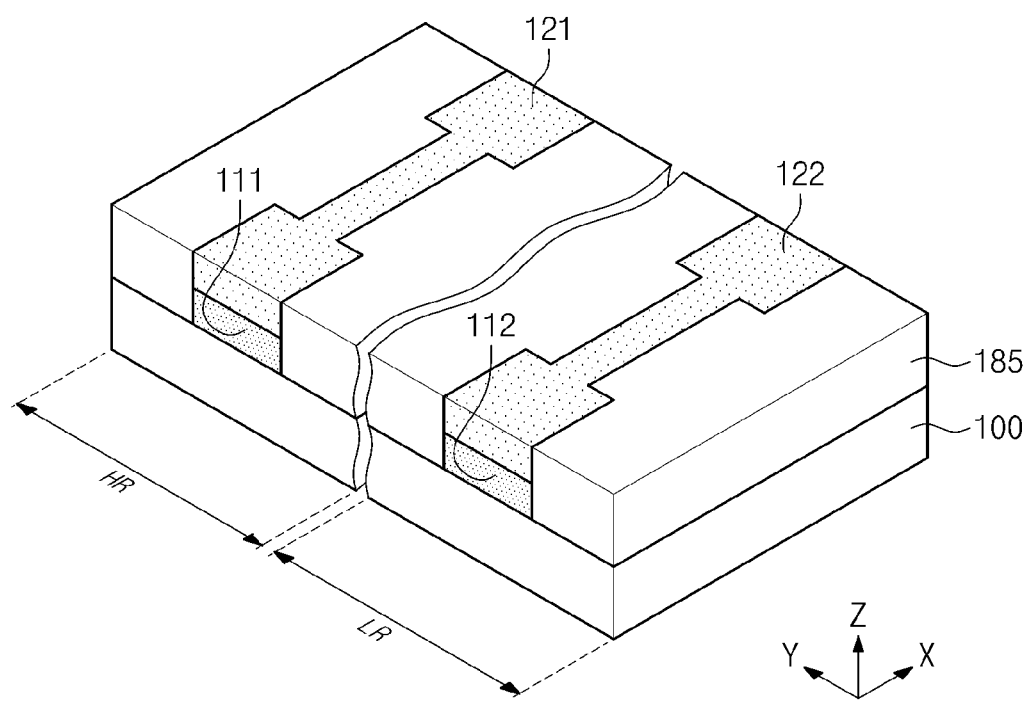

Referring to FIG. 3, an interlayered insulating layer 185 may be formed on the substrate 100 to expose top surfaces of the first and second upper semiconductor patterns 121 and 122. The formation of the interlayered insulating layer 185 may include forming an insulating layer on the substrate 100 using, for example, a CVD process, and performing a planarization process to expose the top surfaces of the first and second upper semiconductor patterns 121 and 122. For example, the interlayered insulating layer 185 may include at least one of silicon oxide, silicon nitride, or silicon oxynitride.

Figure 4:
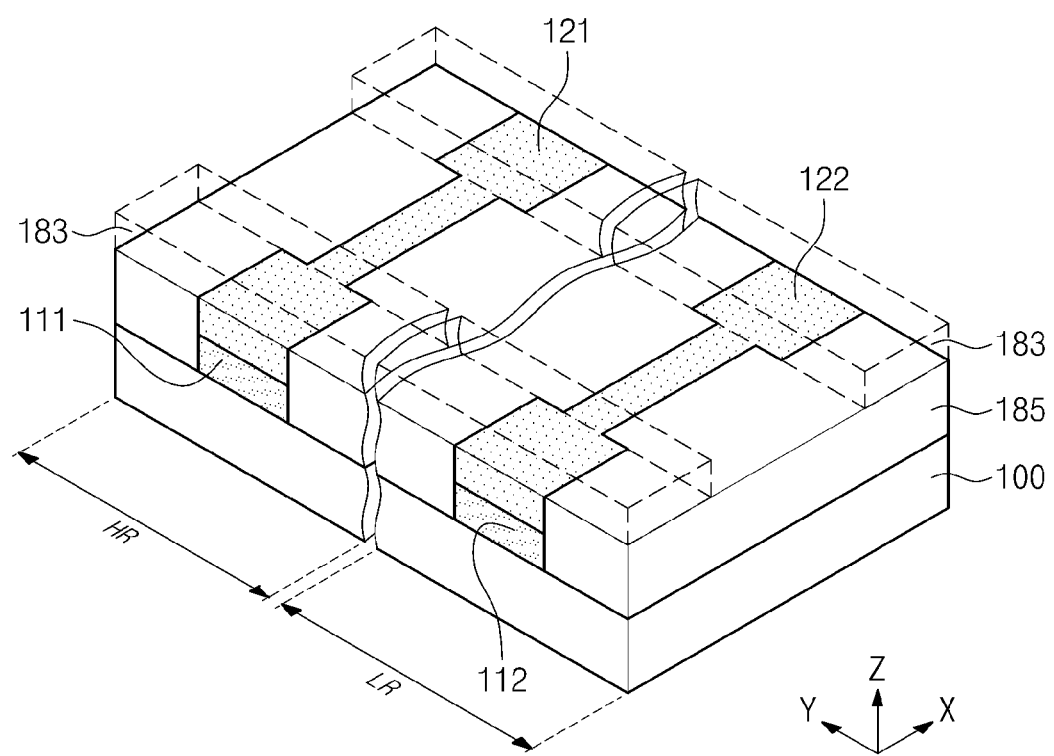

Referring to FIG. 4, second mask patterns 183 may be formed on the resulting structure with the interlayered insulating layer 185 to cover the end portions of the first and second upper semiconductor patterns 121 and 122. The second mask patterns 183 may be formed to expose the center portions of the first and second upper semiconductor patterns 121 and 122. The second mask patterns 183 may include, for example, at least one of photoresist, silicon oxide, silicon nitride, or silicon oxynitride.

Referring to FIG. 5, a portion of the interlayered insulating layer 185 exposed by the second mask patterns 183 may be removed. For example, the removal process may be performed by a dry and/or wet etching process, in which the second mask patterns 183 are used as an etch mask. The removal process may be performed using an etch recipe capable of suppressing the first lower and upper semiconductor patterns 111 and 121 and the second lower and upper semiconductor patterns 112 and 122 from being etched and removing the portion of the interlayered insulating layer 185 exposed by the second mask patterns 183. As the result of the partial removal of the interlayered insulating layer 185, a recess region RS may be formed between the second mask patterns 183. The recess region RS on the high-voltage region HR may be delimited by sidewalls of the interlayered insulating layer 185, the first lower semiconductor pattern 111, and the first upper semiconductor pattern 121 and the top surface of the substrate 100. The recess region RS on the low-voltage region LR may be delimited by sidewalls of the interlayered insulating layer 185, the second lower semiconductor pattern 112, and the second upper semiconductor pattern 122 and the top surface of the substrate 100. As such, the recess region RS may expose the sidewalls of the first lower and upper semiconductor patterns 111 and 121 on the high-voltage region HR, and the sidewalls of the second lower and upper semiconductor patterns 112 and 122 on the low-voltage region LR. The second mask patterns 183 may be removed after the formation of the recess region RS.

Referring to FIG. 6, a third mask pattern 184 may be formed to cover the high-voltage region HR. For example, the third mask pattern 184 may include at least one of silicon nitride, silicon oxide, or silicon oxynitride. The third mask pattern 184 may be formed to expose the low-voltage region LR.

A portion of the second lower semiconductor pattern 112, which is positioned on the low-voltage region LR exposed by the third mask pattern 184, may be removed to form a gap region GA extending from the recess region RS under the second upper semiconductor pattern 122. As the result of the partial removal of the second lower semiconductor pattern 112, remaining semiconductor patterns 113, whose sidewall is covered with the interlayered insulating layer 185, may be formed. The remaining semiconductor patterns 113 may remain under the end portions, respectively, of the second upper semiconductor pattern 122, but not under the center portion. The gap region GA may be a region delimited by a bottom surface of the second upper semiconductor pattern 122 and other sidewalls of the remaining semiconductor patterns 113. In some example embodiments, these sidewalls of the remaining semiconductor patterns 113, which face each other, may be recessed from the sidewalls of the interlayered insulating layer 185. Thus, the remaining semiconductor patterns 113 may have different shapes from the end portions of the second upper semiconductor pattern 122. However, example embodiments may not be limited thereto.

The removing process may be performed using an etch recipe capable of suppressing the second upper semiconductor pattern 122 from being etched and of selectively removing the second lower semiconductor pattern 112. For example, in the case where the second upper semiconductor pattern 122 contains silicon and the second lower semiconductor pattern 112 contains silicon-germanium, the etching process may be performed using etching solution, in which peracetic acid is included. The etching solution may further contain hydrofluoric acid (HF) and deionized water. The high-voltage region HR may be prevented from being etched during the etching process, because it is covered with the third mask pattern 184. The third mask pattern 184 may be removed after the etching process.

Referring to FIGS. 7, 8A, and 8B, a first gate dielectric layer GD1 and a first gate electrode GE1 may be sequentially formed on the first region (e.g., high-voltage region HR), and a second gate dielectric layer GD2 and a second gate electrode GE2 may be sequentially formed on the second region (e.g., low-voltage region LR). The first gate dielectric layer GD1 and the first gate electrode GE1 may be formed to extend along a direction substantially perpendicular to an extending direction of the first upper semiconductor pattern 121 or along a y direction. Similarly, the second gate dielectric layer GD2 and the second gate electrode GE2 may be formed to extend along a direction substantially perpendicular to an extending direction of the second upper semiconductor pattern 122 or the y direction. The first gate electrode GE1 may be formed to cover the center portion of the first upper semiconductor pattern 121 and expose the end portions thereof. Similarly, the second gate electrode GE2 may be formed to cover the center portion of the second upper semiconductor pattern 122 and expose the end portions thereof. The first gate electrode GE1 and second gate electrode GE2 may thus cross the first upper semiconductor pattern 121 and second upper semiconductor pattern 122 respectively.

The first gate dielectric layer GD1 and the first gate electrode GE1 may extend along the sidewalls of the first lower and upper semiconductor patterns 111 and 121. The second gate dielectric layer GD2 and the second gate electrode GE2 may extend into the gap region GA and thereby cover the bottom surface of the second upper semiconductor pattern 122.

The first and second gate dielectric layers GD1 and GD2 may include, for example, a silicon oxide layer. In other example embodiments, the first and second gate dielectric layers GD1 and GD2 may include a high-k material, whose dielectric constant is higher than that of the silicon oxide layer. For example, the first and second gate dielectric layers GD1 and GD2 may include $HfO_2$, $ZrO_2$, or $Ta_2O_5$. The first and second gate dielectric layers GD1 and GD2 may be formed of the same material, but example embodiments may not be limited thereto.

In certain embodiments, the first and second gate electrodes GE1 and GE2 may include at least one of doped silicon, conductive metal nitride, or metal. The first and second gate electrodes GE1 and GE2 may be formed of the same material, but example embodiments are not limited thereto. For example, the first and second gate electrodes GE1 and GE2 may have different work-functions from each other.

The first and second gate dielectric layers GD1 and GD2 and the first and second gate electrodes GE1 and GE2 may be formed by sequentially performing deposition and patterning processes. In example embodiments, the deposition process may be performed using a CVD or sputtering process. In other example embodiments, the first and second gate dielectric layers GD1 and GD2 and the first and second gate electrodes GE1 and GE2 may be formed by a replacement process, in which at least one dummy pattern is used. For example, the dummy pattern may be formed to cover the first and second upper semiconductor patterns 121 and 122, and then, the dummy pattern may be replaced with the first and second gate dielectric layers GD1 and GD2 and the first and second gate electrodes GE1 and GE2. In this case, the formation of the first and second gate electrodes GE1 and GE2 may include a damascene process.

In certain embodiments, as a result of the processes described with reference to FIGS. 1 through 7, a first transistor TR1 is formed on the high-voltage region HR and a second transistor TR2 is formed on the low-voltage region LR. The first transistor TR1 may include a fin-shaped first channel region CH1 protruding from the substrate 100 and thereby have a fin-FET channel structure. The second transistor TR2 may include a second channel region CH2, which is spaced apart from the substrate 100. The second channel region CH2 may have an outer surface that is wholly enclosed by the second gate electrode GE2 (e.g., on a top, bottom, and both sides of the second channel region CH2 are enclosed by the second gate electrode GE2), and thus, the second transistor TR2 may have a gate-all-around field effect transistor (GAA FET) channel structure. According to example embodiments, the fin-FET and the GAA-FET can be simultaneously and easily formed without using a selective epitaxial growth process and/or an SOI wafer.

Hereinafter, a semiconductor device according to example embodiments will be described with reference to FIGS. 7, 8A, and 8B. The semiconductor device may include the first transistor TR1 provided on the high-voltage region HR of the substrate 100 and the second transistor TR2 provided on the low-voltage region LR of the substrate 100. The substrate 100 may be a semiconductor wafer containing, for example, silicon, germanium, or silicon-germanium. In example embodiments, the first transistor TR1 may be a high-voltage transistor having a relatively high operation voltage (e.g., high Vdd or of 1V or higher), while the second transistor TR2 may be a low-voltage transistor having a relatively low operation voltage (e.g., low Vdd or lower than 1V). The first transistor TR1 may have a higher threshold voltage than the second transistor TR2. For example, the first transistor TR1 may serve as a transistor constituting input/output (I/O) circuits of the semiconductor device, and the second transistor TR2 may serve as a transistor constituting logic circuits of the semiconductor device. Both of the first and second transistors TR1 and TR2 may be NMOSFETs or PMOSFETs. In other example embodiments, one of the first and second transistors TR1 and TR2 may be an NMOSFET, and the other a PMOSFET.

The first transistor TR1 may include a fin portion FN protruding from the substrate 100 along a z direction. The fin portion FN may include a first channel region CH1 and first source/drain regions SD1 that are spaced apart from each other, in the x direction, by the first channel region CH1. The first channel region CH1 may have a smaller width (e.g., in the y direction) than the first source/drain regions SD1.

The fin portion FN may include the first lower semiconductor pattern 111 and the first upper semiconductor pattern 121 that are sequentially stacked on the substrate 100. For example, the first channel region CH1 may include the first lower and upper semiconductor patterns 111 and 121. Each of pairs of materials, which were described in one of examples 1-11 in the above table 1, may be used for the first lower semiconductor pattern 111 and the first upper semiconductor pattern 121. In other words, the first lower semiconductor pattern 111 may include a material having an etch selectivity with respect to the first upper semiconductor pattern 121.

The first gate dielectric layer GD1 and the first gate electrode GE1 may be provided on the first channel region CH1. The first gate dielectric layer GD1 and the first gate electrode GE1 may cross the first channel region CH1 and cover the side and top surfaces of the first channel region CH1. The first gate dielectric layer GD1 may include, for example, a silicon oxide layer. In other example embodiments, the first gate dielectric layer GD1 may include a high-k material, whose a dielectric constant is higher than that of the silicon oxide layer. For example, the first gate dielectric layer GD1 may include $HfO_2$, $ZrO_2$, or $Ta_2O_5$. The first gate electrode GE1 may include at least one of doped silicon, conductive metal nitride, or metal, for example.

The first channel region CH1 may be directly connected to the substrate 100. For example, the first lower semiconductor pattern 111 may have a bottom surface that contacts the top surface of the substrate 100. Accordingly, the channel region of the first transistor TR1 may be electrically connected to the substrate 100 or a body portion of the device. Such a body contact structure may relieve a hot carrier effect, which may occur when the first transistor TR1 is operated. Generally, the shorter a channel length of a FET, the higher an electric field at a drain junction. Accordingly, electric carriers may have a sufficiently high kinetic energy to cause impact ionization at the drain junction; that is, hot carriers may be produced. Such hot carriers may produce secondary electron-hole pairs deteriorating characteristics of the transistor. According to example embodiments, although a relatively high voltage causing the hot carrier effect is applied to the first transistor TR1, it is possible to easily discharge electric charges, produced by the hot carriers, to the substrate 100, because the first channel region CH1 is directly connected to the substrate 100.

The second transistor TR2 may include the second channel region CH2 spaced apart from the substrate 100 by the second gate electrode GE2 and the second gate dielectric layer GD2. The second channel region CH2 may have, for example, a rectangular section, but example embodiments are not limited thereto. The second gate dielectric layer GD2 and the second gate electrode GE2 may be sequentially provided on the second channel region CH2. The second gate dielectric layer GD2 and the second gate electrode GE2 may extend into a gap region GA between the second upper semiconductor pattern 122 and the substrate 100. For example, the second gate dielectric layer GD2 and the second gate electrode GE2 may cover the top, bottom, and side surfaces of the second channel region CH2. As such, the second gate dielectric layer GD2 and the second gate electrode GE2 may enclose an outer surface of the second channel region CH2, and the second channel region CH2 may penetrate the second gate electrode GE2. In one embodiment, the second channel region CH2 has the bottom surface that is substantially coplanar with an interface between the first upper and lower semiconductor patterns 121 and 111.

The second gate dielectric layer GD2 may include, for example, a silicon oxide layer. In other example embodiments, the second gate dielectric layer GD2 may include a high-k material, whose dielectric constant is higher than that of the silicon oxide layer. For example, the second gate dielectric layer GD2 may include $HfO_2$, $ZrO_2$, or $Ta_2O_5$. The second gate electrode GE2 may include at least one of doped silicon, conductive metal nitride, or metal. In example embodiments, the second gate electrode GE2 may have a different work-function from the first gate electrode GE1.

The second transistor TR2 may include second source/drain regions SD2 that are spaced apart from each other, in the x direction, by the second channel region CH2. The second channel region CH2 may have a smaller width (e.g., in the y direction) than the second source/drain regions SD2. The second source/drain regions SD2 may be provided in the remaining semiconductor patterns 113 and portions of the second upper semiconductor pattern 122 that are sequentially stacked on the substrate 100. The remaining semiconductor patterns 113 may be spaced apart from each other by the second gate electrode GE2, in the x direction. Each of pairs of materials, which were described in one of examples 1-11 in the above table 1, may be used for the remaining semiconductor patterns 113 and the second upper semiconductor pattern 122. For example, the remaining semiconductor patterns 113 may include a material having an etch selectivity with respect to the second upper semiconductor pattern 122. A lower portion of the second source/drain regions SD2 (i.e., the remaining semiconductor patterns 113) may include the same material as the first lower semiconductor pattern 111, and the second upper semiconductor pattern 122 may include the same material as the first upper semiconductor pattern 121. Further, the first channel region CH1 may include the first lower semiconductor pattern 111 including the same material as the second channel region CH2 and the first upper semiconductor pattern 121 including a different material from the second channel region CH2.

The second transistor TR2 may have a gate-all-around structure. For example, the second channel region CH2 may be provided in the form of a nano wire or a nanotube, whose width (e.g., in the y direction) ranges from several nanometers to several tens nanometers. In one embodiment, the second channel region CH2 has a width between 5 and 30 nm. Such a structure of the second channel region CH2 may relieve a narrow channel effect in the second transistor TR2. For example, all of the top, side, and bottom surfaces of the second channel region CH2 may be used as a channel region of the second transistor TR2. The second transistor TR2 can have an increased channel width, compared with, for example, a conventional fin-FET channel structure In general, the smaller a channel width of a FET, the lower an amount of electric current in the gate-controlled channel region. Further, a narrow channel FET may suffer from a change in threshold voltage. However, according to example embodiments, the second channel region CH2 has a gate-all-around structure, and thus, it is possible to suppress the narrow channel effect of the second transistor TR2.

Figure 9:
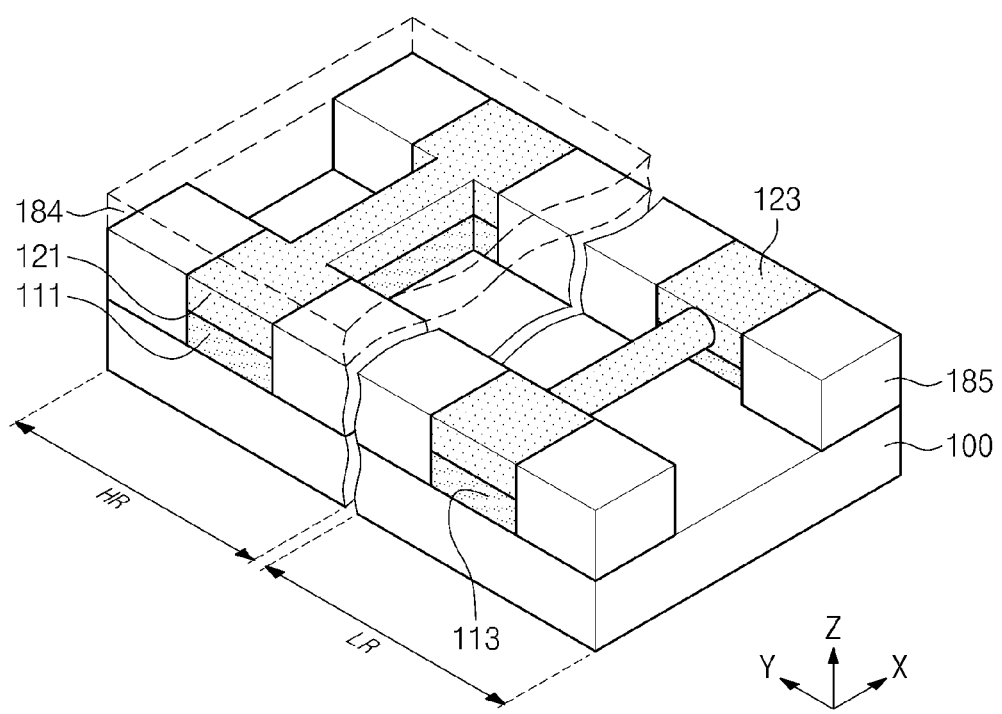
FIG. 9 is a perspective view illustrating a method of fabricating a semiconductor device, according to other example embodiments.
Figure 10A:
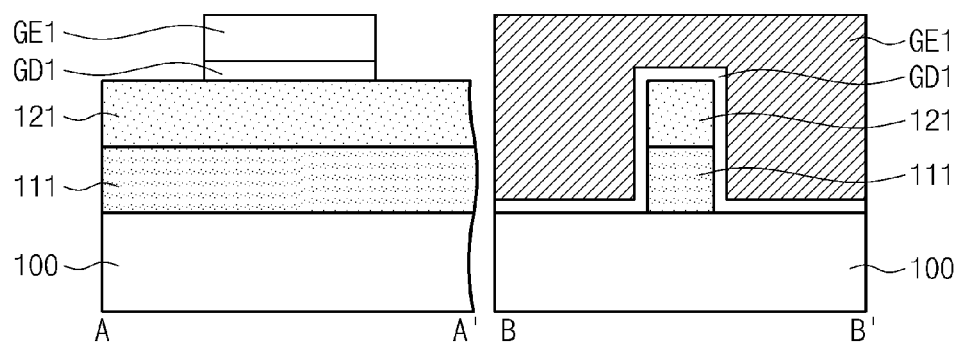
FIG. 10A is an exemplary sectional view taken along lines A-A' and B-B' of FIG. 7.
Figure 10B:
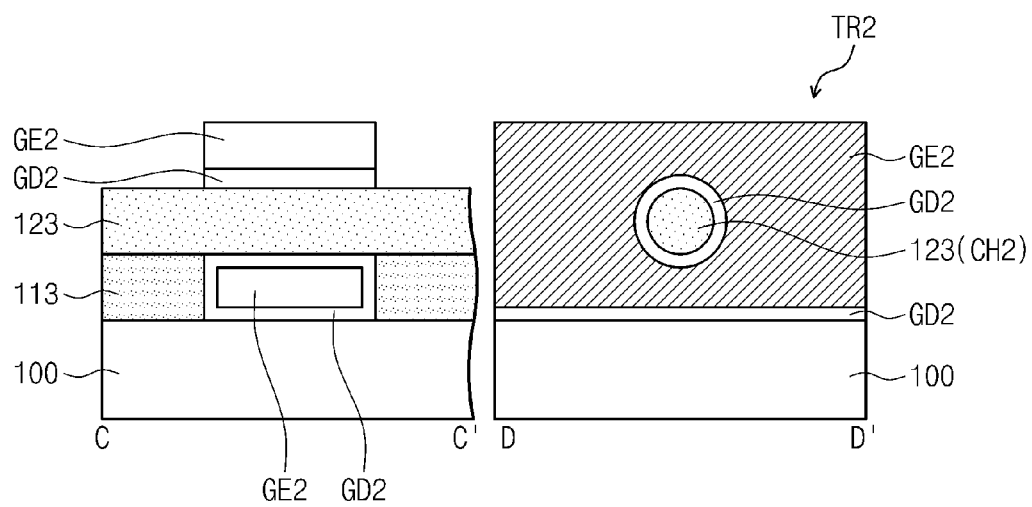
FIG. 10B is an exemplary sectional view taken along lines C-C' and D-D' of FIG. 7.

FIG. 9 is a perspective view illustrating a method of fabricating a semiconductor device, according to other example embodiments. FIGS. 10A and 10B are sectional views illustrating a semiconductor device according to other example embodiments. FIG. 10A is an exemplary sectional view taken along lines A-A' and B-B' of FIG. 7, and FIG. 10B is an exemplary sectional view taken along lines C-C' and D-D' of FIG. 7. For the sake of brevity, again, the elements and features of this example that are similar to those previously shown and described will not be described in much further detail.

Referring to FIGS. 9, 10A, and 10B, in a semiconductor device according to other example embodiments, a second transistor TR2 includes a second channel region CH2 having a rounded surface. For example, a section of the second channel region CH2 may be shaped like a circle or ellipse. As shown in FIG. 9, a surface treatment process may be performed to the resulting structure described with reference to FIG. 6 to form a second upper semiconductor pattern 123 having a rounded surface. For example, the surface treatment process may include exposing the structure of FIG. 6 to HCl-containing gas and performing an annealing process under H2 ambient.

Figure 15:
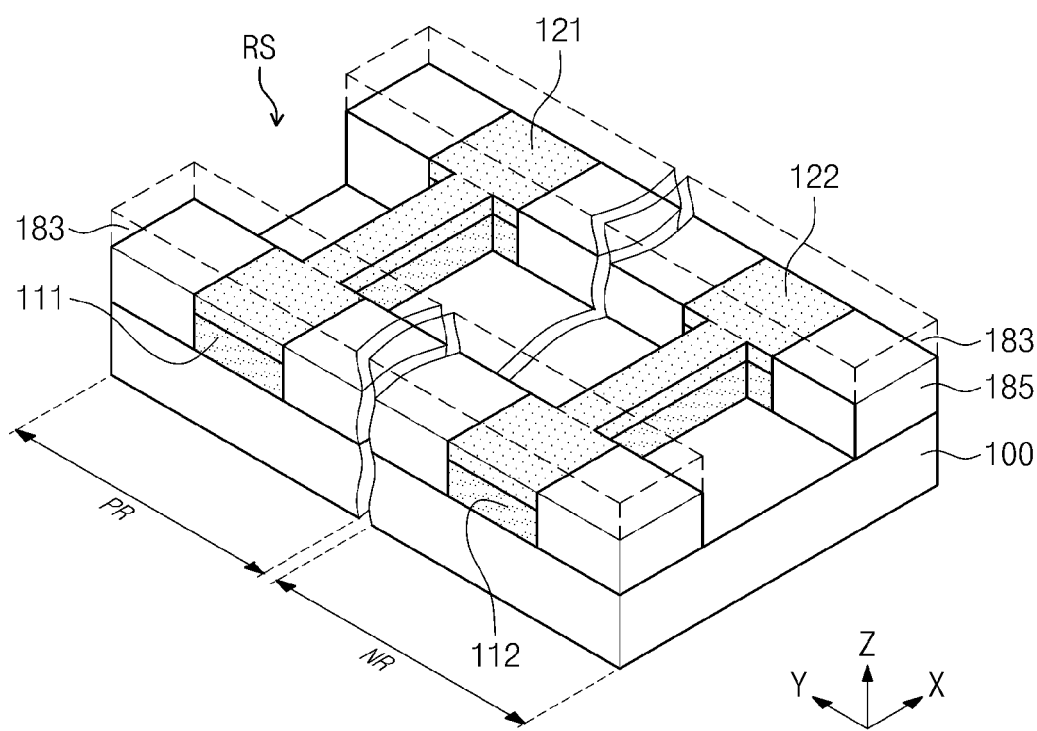
Figure 16:
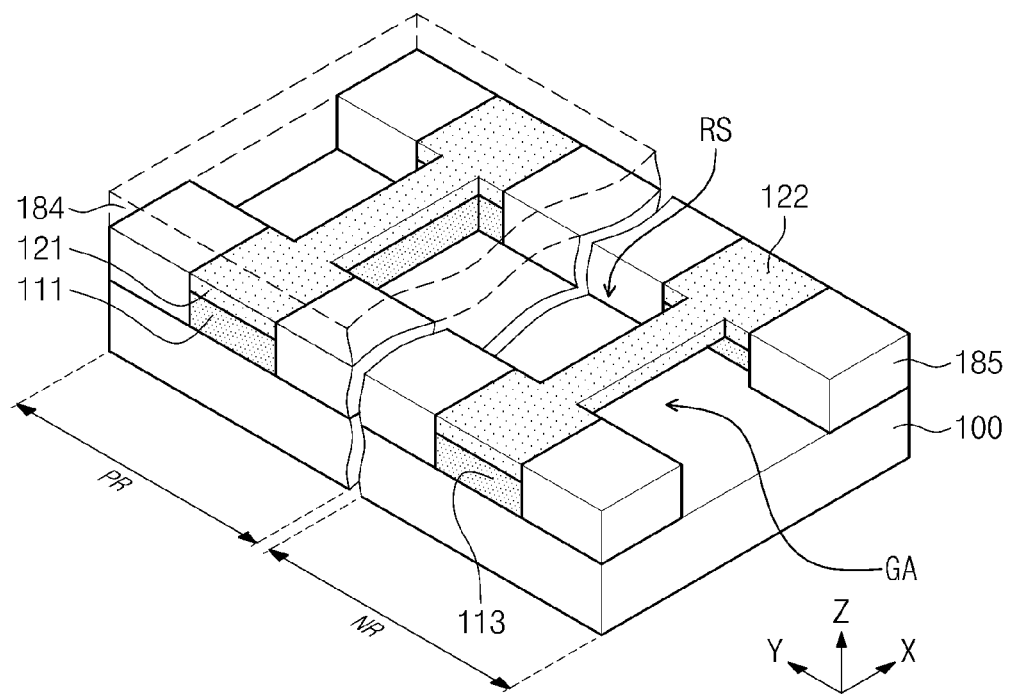
Figure 17:
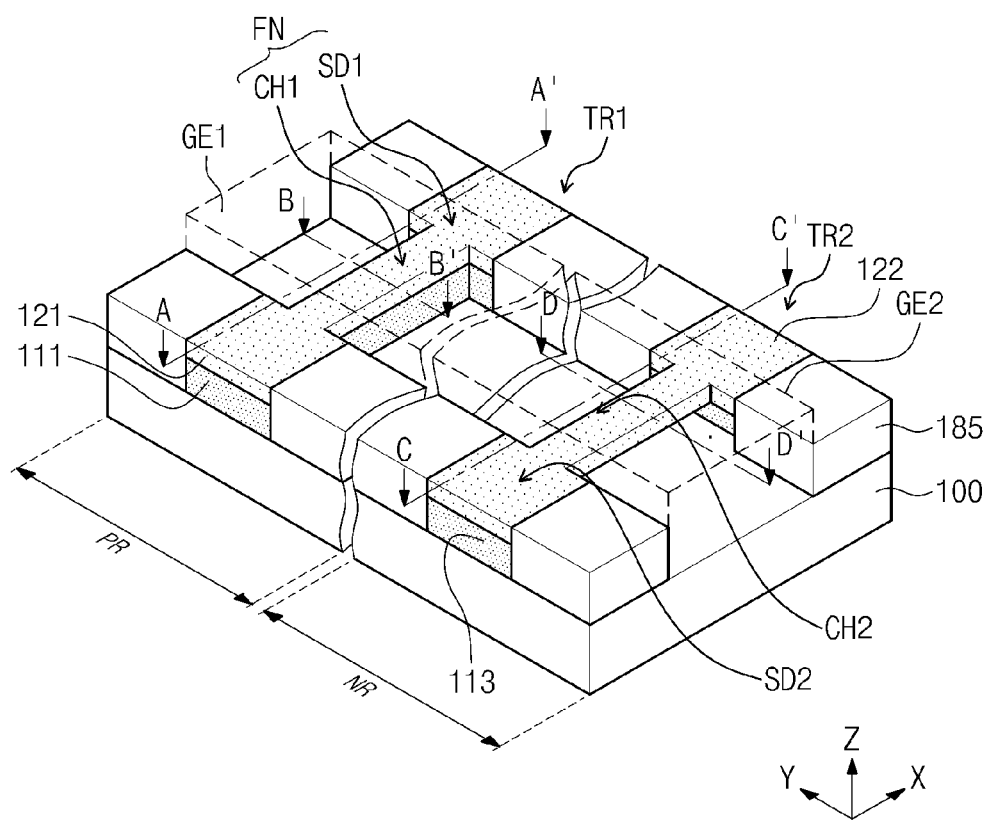
Figure 18A:
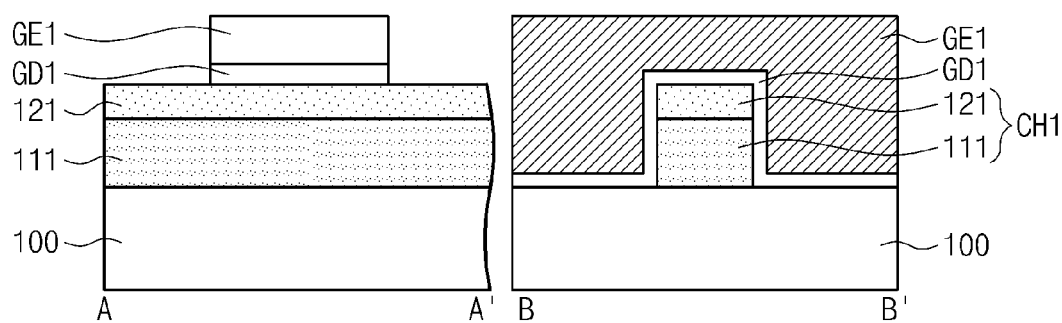
FIG. 18A is an exemplary sectional view taken along lines A-A' and B-B' of FIG. 17.
Figure 18B:
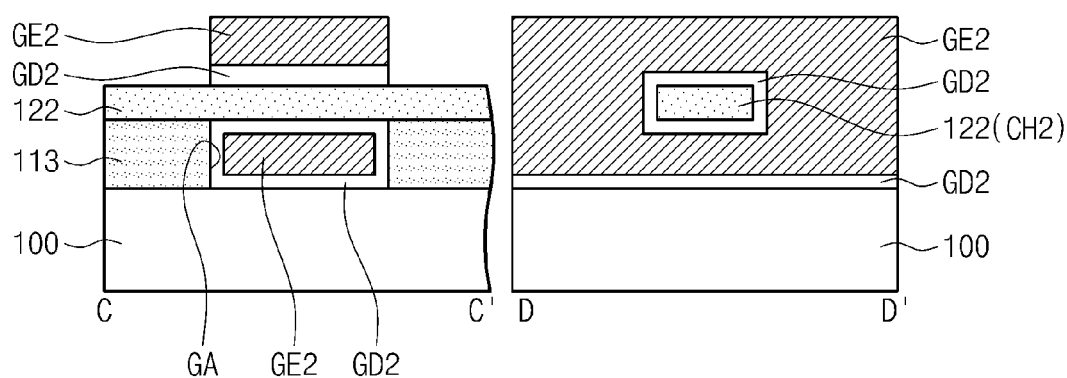
FIG. 18B is an exemplary sectional view taken along lines C-C' and D-D' of FIG. 17.

FIGS. 11 through 17 are perspective views illustrating a method of fabricating a semiconductor device, according to still other example embodiments. FIG. 18A is an exemplary sectional view taken along lines A-A' and B-B' of FIG. 17, and FIG. 18B is an exemplary sectional view taken along lines C-C' and D-D' of FIG. 17.

Figure 11:
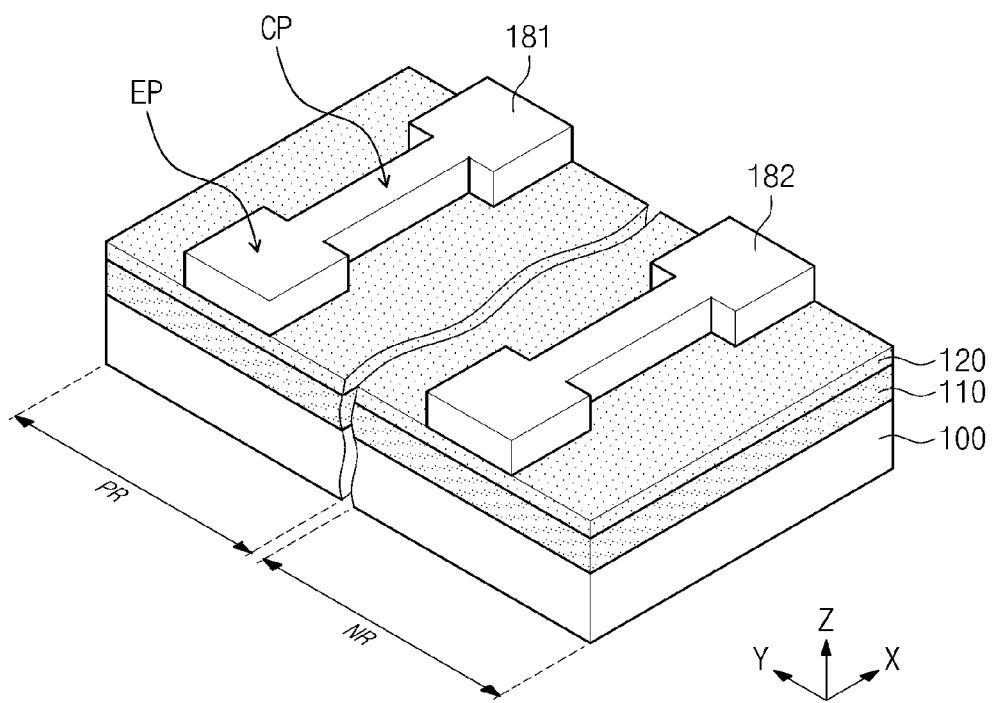
FIGS. 11 through 17 are perspective views illustrating a method of fabricating a semiconductor device, according to still other example embodiments.

Referring to FIG. 11, a first semiconductor layer 110 and a second semiconductor layer 120 may be sequentially formed on a substrate 100. The substrate 100 may include a first region and a second region. In the present embodiment, the first region may be a PMOSFET region PR, and the second region may be an NMOSFET region NR. The substrate 100 may be a semiconductor wafer containing, for example, silicon, germanium, or silicon-germanium.

The first semiconductor layer 110 may include a material having an etch selectivity with respect to the second semiconductor layer 120. For example, when the first semiconductor layer 110 is etched using a predetermined etch recipe, the first semiconductor layer 110 may be formed of a material that can be selectively etched, while preventing the second semiconductor layer 120 from being etched. The etch selectivity may be quantitatively expressed in terms of a ratio of an etch rate of the first semiconductor layer 110 to an etch rate of the second semiconductor layer 120. In example embodiments, the first semiconductor layer 110 may be one of materials having an etch selectivity ranging from 10:1 to 200:1, with respect to the second semiconductor layer 120. In other words, the etch rate of the first semiconductor layer 110 is faster than the etch rate of the second semiconductor layer 120. For example, materials, which were described in one of examples 1-11 in the above table 1, may be used for the first and second semiconductor layers 110 and 120.

The first and second semiconductor layers 110 and 120 may be formed, for example, by an epitaxial growth process using the substrate 100 as a seed layer. For example, the epitaxial growth process may be performed by a chemical vapor deposition (CVD) process or a molecular beam epitaxy (MBE) process. The first and second semiconductor layers 110 and 120 may be continuously formed in the chamber. In example embodiments, the first and second semiconductor layers 110 and 120 may be grown to cover conformally a whole top surface of the substrate 100. For example, the first and second semiconductor layers 110 and 120 may not be selectively grown from the substrate 100. In the present embodiment, the first semiconductor layer 110 may be formed thicker than the second semiconductor layer 120 (e.g., in the z direction).

First mask patterns 181 and 182 may be formed on the second semiconductor layer 120. In order to reduce complexity in the drawings and to provide better understanding of example embodiments, the first mask patterns 181 and 182 are illustrated to have the same shape on the PMOSFET and NMOSFET regions PR and NR, but example embodiments are not limited thereto. The first mask patterns 181 and 182 may be formed in such a way that both end portions EP thereof have a larger width(in y direction) than that of a center portion CP disposed therebetween. Here, the end portions EP may be disposed spaced apart from each other in an x direction. The first mask patterns 181 and 182 may include at least one of photoresist, silicon nitride, silicon oxide, or silicon oxynitride. The first mask patterns 181 and 182 may be formed using a CVD process.

Figure 12:
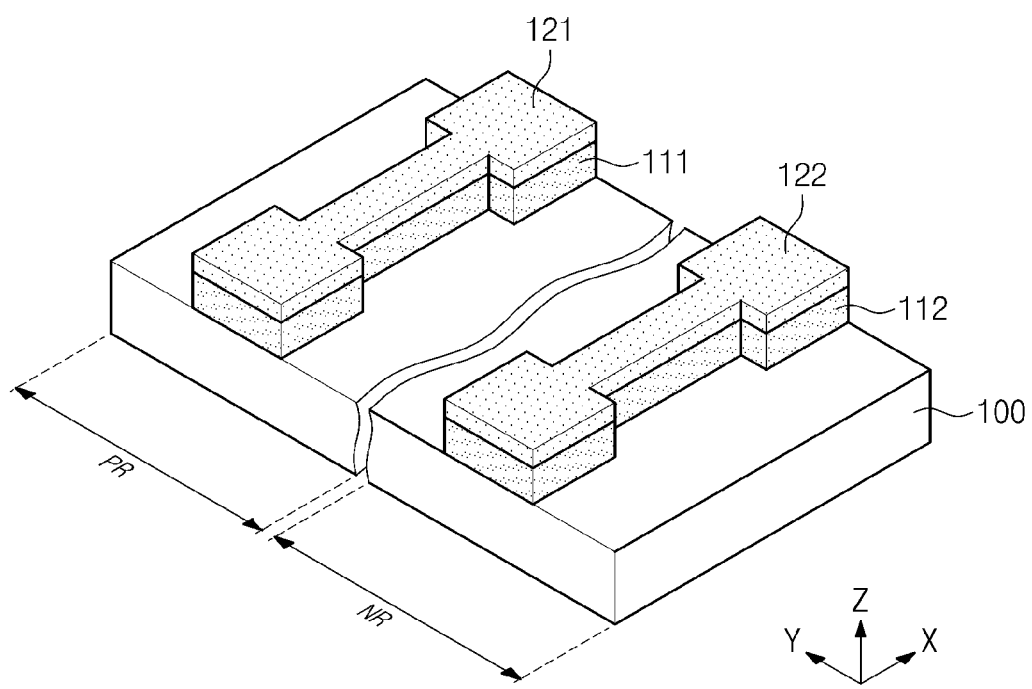

Referring to FIG. 12, a patterning process may be performed using the first mask patterns 181 and 182 as an etch mask. Accordingly, a first lower semiconductor pattern 111 and a first upper semiconductor pattern 121 may be sequentially stacked on the PMOSFET region PR, and a second lower semiconductor pattern 112 and a second upper semiconductor pattern 122 may be sequentially stacked on the NMOSFET region NR. Since the first mask pattern 181 on the PMOSFET region PR is used as the etch mask, the first lower and upper semiconductor patterns 111 and 121 may be formed in such a way that both end portions thereof have a larger width(in y direction) than that of a center portion thereof. Similarly, since the first mask pattern 182 on the NMOSFET region NR is used as the etch mask, the second lower and upper semiconductor patterns 112 and 122 may be formed in such a way that both end portions thereof have a larger width(in y direction) than that of a center portion thereof. The patterning process may include, for example, a dry and/or wet etching process. For example, the patterning process may be performed using an anisotropic dry etching process. After the patterning process, the first mask patterns 181 and 182 may be removed. For example, the removal of the first mask patterns 181 and 182 may be performed using an ashing process or a wet etching process.

Figure 13:
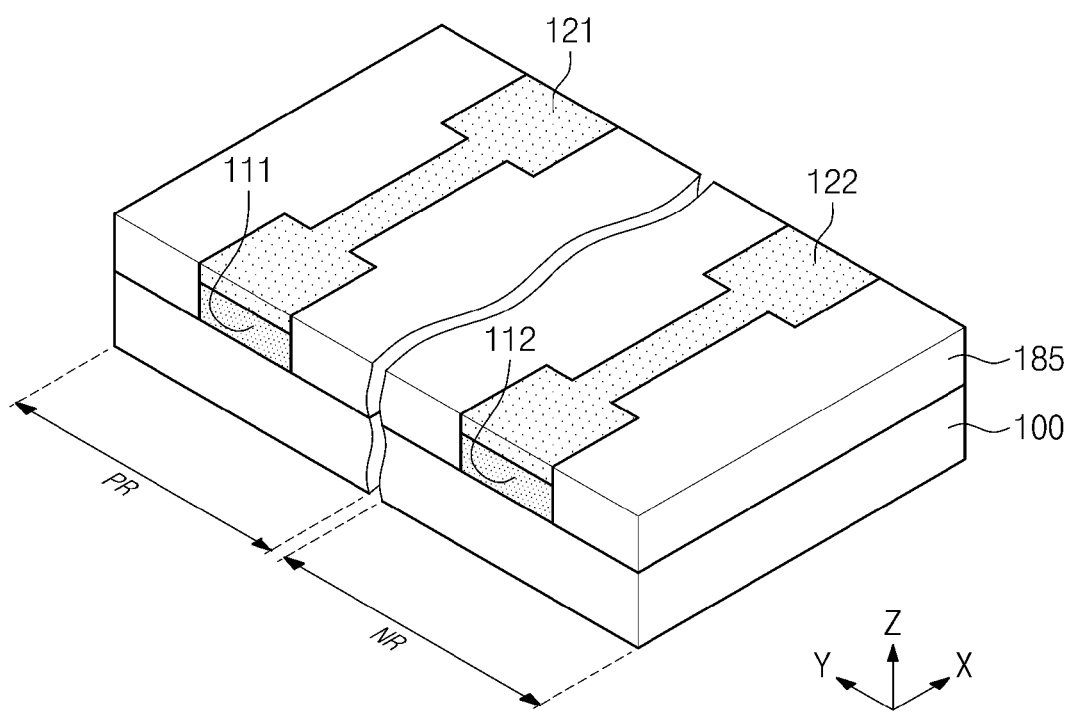

Referring to FIG. 13, an interlayered insulating layer 185 is formed on the substrate 100 to expose top surfaces of the first and second upper semiconductor patterns 121 and 122. The formation of the interlayered insulating layer 185 may include forming an insulating layer on the substrate 100 using a CVD process, and performing a planarization process to expose the top surfaces of the first and second upper semiconductor patterns 121 and 122. For example, the interlayered insulating layer 185 may include at least one of silicon oxide, silicon nitride, or silicon oxynitride.

Figure 14:
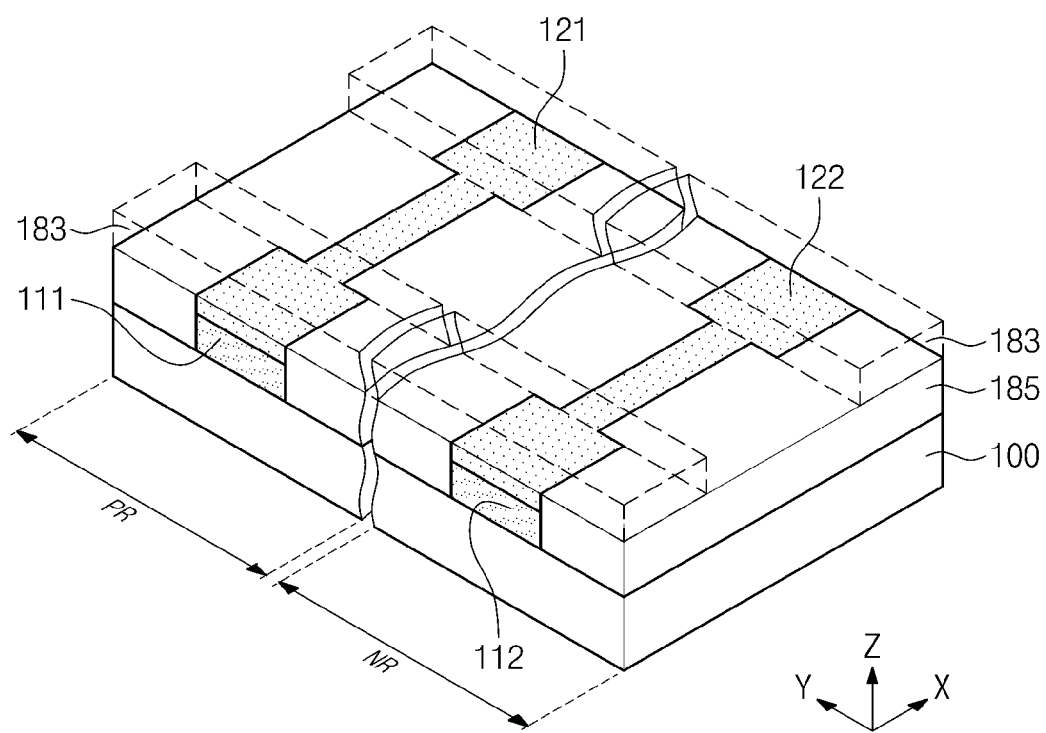

Referring to FIG. 14, second mask patterns 183 may be formed on the resulting structure with the interlayered insulating layer 185 to cover the end portions of the first and second upper semiconductor patterns 121 and 122. The second mask patterns 183 may be formed to expose the center portions of the first and second upper semiconductor patterns 121 and 122. The second mask patterns 183 may include, for example, at least one of photoresist, silicon oxide, silicon nitride, or silicon oxynitride.

Referring to FIG. 15, a portion of the interlayered insulating layer 185 exposed by the second mask patterns 183 may be removed. For example, the removal process may be performed by a dry and/or wet etching process, in which the second mask patterns 183 are used as an etch mask. The removal process may be performed using an etch recipe capable of suppressing the first lower and upper semiconductor patterns 111 and 121 and the second lower and upper semiconductor patterns 112 and 122 from being etched and removing the portion of the interlayered insulating layer 185 exposed by the second mask patterns 183. As the result of the partial removal of the interlayered insulating layer 185, a recess region RS may be formed between the second mask patterns 183. The recess region RS on the PMOSFET region PR may be delimited by sidewalls of the interlayered insulating layer 185, the first lower semiconductor pattern 111, and the first upper semiconductor pattern 121 and the top surface of the substrate 100. The recess region RS on the NMOSFET region NR may be delimited by sidewalls of the interlayered insulating layer 185, the second lower semiconductor pattern 112, and the second upper semiconductor pattern 122 and the top surface of the substrate 100. As such, the recess region RS may expose the sidewalls of the first lower and upper semiconductor patterns 111 and 121 on the PMOSFET region PR, and the sidewalls of the second lower and upper semiconductor patterns 112 and 122 on the NMOSFET region NR. The second mask patterns 183 may be removed after the formation of the recess region RS.

Referring to FIG. 16, a third mask pattern 184 may be formed to cover the PMOSFET region PR. For example, the third mask pattern 184 may include at least one of silicon nitride, silicon oxide, or silicon oxynitride. The third mask pattern 184 may be formed to expose the NMOSFET region NR.

A portion of the second lower semiconductor pattern 112, which is positioned on the NMOSFET region NR exposed by the third mask pattern 184, may be removed to form a gap region GA extending from the recess region RS under the second upper semiconductor pattern 122. As the result of the partial removal of the second lower semiconductor pattern 112, remaining semiconductor patterns 113, whose sidewall is covered with the interlayered insulating layer 185, may be formed. The remaining semiconductor patterns 113 may remain under the end portions, respectively, of the second upper semiconductor pattern 122, but not under the center portion. The gap region GA may be a region delimited by a bottom surface of the second upper semiconductor pattern 122 and other sidewalls of the remaining semiconductor patterns 113.

The removing process may be performed, for example, using an etch recipe capable of suppressing the second upper semiconductor pattern 122 from being etched and of selectively removing the second lower semiconductor pattern 112. For example, in the case where the second upper semiconductor pattern 122 contains silicon and the second lower semiconductor pattern 112 contains silicon-germanium, the etching process may be performed using etching solution, in which peracetic acid is included. The etching solution may further contain hydrofluoric acid (HF) and deionized water. The PMOSFET region PR may be prevented from being etched during the etching process, because it is covered with the third mask pattern 184. The third mask pattern 184 may be removed after the etching process.

Referring to FIGS. 17, 18A, and 18B, a first gate dielectric layer GD1 and a first gate electrode GE1 may be sequentially formed on the PMOSFET region PR, and a second gate dielectric layer GD2 and a second gate electrode GE2 may be sequentially formed on the NMOSFET region NR. The first gate dielectric layer GD1 and the first gate electrode GE1 may be formed to extend along a direction substantially perpendicular to an extending direction of the first upper semiconductor pattern 121 or along a y direction. Similarly, the second gate dielectric layer GD2 and the second gate electrode GE2 may be formed to extend along a direction substantially perpendicular to an extending direction of the second upper semiconductor pattern 122 or the y direction. The first gate electrode GE1 may be formed to cover the center portion of the first upper semiconductor pattern 121 and expose the end portions thereof. Similarly, the second gate electrode GE2 may be formed to cover the center portion of the second upper semiconductor pattern 122 and expose the end portions thereof.

The first gate dielectric layer GD1 and the first gate electrode GE1 may extend along the sidewalls of the first lower and upper semiconductor patterns 111 and 121. The second gate dielectric layer GD2 and the second gate electrode GE2 may extend into the gap region GA and thereby cover the bottom surface of the second upper semiconductor pattern 122.

The first and second gate dielectric layers GD1 and GD2 may include, for example, a silicon oxide layer. In other example embodiments, the first and second gate dielectric layers GD1 and GD2 may include a high-k material, whose dielectric constant is higher than that of the silicon oxide layer. For example, the first and second gate dielectric layers GD1 and GD2 may include $HfO_2$, $ZrO_2$, or $Ta_2O_5$. The first and second gate dielectric layers GD1 and GD2 may be formed of the same material, but example embodiments are not limited thereto.

The first and second gate electrodes GE1 and GE2 may include, for example, at least one of doped silicon, conductive metal nitride, or metal. The first and second gate electrodes GE1 and GE2 may be formed of the same material, but example embodiments are not limited thereto. For example, the first and second gate electrodes GE1 and GE2 may have different work-functions from each other.

The first and second gate dielectric layers GD1 and GD2 and the first and second gate electrodes GE1 and GE2 may be formed by sequentially performing deposition and patterning processes. In example embodiments, the deposition process may be performed using a CVD or sputtering process. In other example embodiments, the first and second gate dielectric layers GD1 and GD2 and the first and second gate electrodes GE1 and GE2 may be formed by a replacement process, in which at least one dummy pattern is used. For example, the dummy pattern may be formed to cover the first and second upper semiconductor patterns 121 and 122, and the dummy pattern may be replaced with the first and second gate dielectric layers GD1 and GD2 and the first and second gate electrodes GE1 and GE2. In this case, the formation of the first and second gate electrodes GE1 and GE2 may include a damascene process.

As a result of the processes described with reference to FIGS. 11 through 17, a first transistor TR1 may be formed on the PMOSFET region PR and a second transistor TR2 may be formed on the NMOSFET region NR. The first transistor TR1 may include a fin-shaped first channel region CH1 protruding from the substrate 100 and thereby have a fin-FET structure. The second transistor TR2 may include a second channel region CH2, which is spaced apart from the substrate 100. The second channel region CH2 may have an outer surface that is wholly enclosed by the second gate electrode GE2, and thus, the second transistor TR2 may have a gate-all-around field effect transistor (GAA FET) structure. According to still other example embodiments, the fin-FET and the GAA-FET can be simultaneously and easily formed without using a selective epitaxial growth process and/or an SOI wafer.

Hereinafter, a semiconductor device according to still other example embodiments will be described with reference to FIGS. 17, 18A, and 18B. The semiconductor device may include the first transistor TR1 provided on the PMOSFET region PR of the substrate 100 and the second transistor TR2 provided on the NMOSFET region NR of the substrate 100. The substrate 100 may be a semiconductor wafer containing, for example, silicon, germanium, or silicon-germanium. In example embodiments, the first transistor TR1 may be a PMOS transistor, while the second transistor TR2 may be an NMOS transistor.

The first transistor TR1 may include a fin portion FN protruding from the substrate 100 along a z direction. The fin portion FN may include a first channel region CH1 and first source/drain regions SD1 that are spaced apart from each other, in the x direction, by the first channel region CH1. The first channel region CH1 may have a smaller width(in y direction) than the first source/drain regions SD1.

The fin portion FN may include the first lower semiconductor pattern 111 and the first upper semiconductor pattern 121 that are sequentially stacked on the substrate 100. For example, the first channel region CH1 may include the first lower and upper semiconductor patterns 111 and 121. Each of pairs of materials, which were described in one of examples 1-11 in the above table 1, may be used for the first lower semiconductor pattern 111 and the first upper semiconductor pattern 121. For example, the first lower semiconductor pattern 111 may include a material having an etch selectivity with respect to the first upper semiconductor pattern 121. The first lower semiconductor pattern 111 may be thicker than the first upper semiconductor pattern 121.

The first gate dielectric layer GD1 and the first gate electrode GE1 may be provided on the first channel region CH1. The first gate dielectric layer GD1 and the first gate electrode GE1 may cross the first channel region CH1 and cover the side and top surfaces of the first channel region CH1. The first gate dielectric layer GD1 may include, for example, a silicon oxide layer. In other example embodiments, the first gate dielectric layer GD1 may include a high-k material, whose a dielectric constant is higher than that of the silicon oxide layer. For example, the first gate dielectric layer GD1 may include $HfO_2$, $ZrO_2$, or $Ta_2O_5$. The first gate electrode GE1 may include, for example, at least one of doped silicon, conductive metal nitride, or metal.

The first channel region CH1 may be directly connected to the substrate 100. For example, the first lower semiconductor pattern 111 may have a bottom surface that contacts the top surface of the substrate 100. Accordingly, the channel region of the first transistor TR1 may be electrically connected to the substrate 100 or a body portion of the device. Such a body contact structure may relieve a hot carrier effect, which may occur when the first transistor TR1 is operated.

The second transistor TR2 may include the second channel region CH2 spaced apart from the substrate 100 by the second gate electrode GE2 and the second gate dielectric layer GD2. In one embodiment, the second channel region CH2 has a horizontal width (e.g., in the y direction) that is larger than vertical width (e.g., a thickness in the z direction), and thus, a section thereof may be shaped like a rectangle. However, example embodiments are not limited thereto. In other example embodiments, the second channel region CH2 may have the same or similar shape as that of FIG. 8b.

The second gate dielectric layer GD2 and the second gate electrode GE2 may be sequentially provided on the second channel region CH2. The second gate dielectric layer GD2 and the second gate electrode GE2 may extend into a gap region GA between the second upper semiconductor pattern 122 and the substrate 100. For example, the second gate dielectric layer GD2 and the second gate electrode GE2 may cover the top, bottom, and side surfaces of the second channel region CH2. Accordingly, the second gate dielectric layer GD2 and the second gate electrode GE2 may enclose an outer surface of the second channel region CH2, and the second channel region CH2 may penetrate the second gate electrode GE2. The second channel region CH2 may have the bottom surface that is substantially coplanar with an interface between the first upper and lower semiconductor patterns 121 and 111.

The second gate dielectric layer GD2 may include, for example, a silicon oxide layer. In other example embodiments, the second gate dielectric layer GD2 may include a high-k material, whose dielectric constant is higher than that of the silicon oxide layer. For example, the second gate dielectric layer GD2 may include $HfO_2$, $ZrO_2$, or $Ta_2O_5$. The second gate electrode GE2 may include at least one of doped silicon, conductive metal nitride, or metal. In example embodiments, the second gate electrode GE2 may have a different work-function from the first gate electrode GE1.

The second transistor TR2 may include second source/drain regions SD2 that are spaced apart from each other, in the x direction, by the second channel region CH2. The second channel region CH2 may have a smaller width(in y direction) than the second source/drain regions SD2. The second source/drain regions SD2 may include the remaining semiconductor patterns 113 and the second upper semiconductor pattern 122 that are sequentially stacked on the substrate 100. The remaining semiconductor patterns 113 may be spaced apart from each other, in the x direction, by the second gate electrode GE2. Each of pairs of materials, which were described in one of examples 1-11 in the above table 1, may be used for the remaining semiconductor patterns 113 and the second upper semiconductor pattern 122. For example, the remaining semiconductor patterns 113 may include a material having an etch selectivity with respect to the second upper semiconductor pattern 122. A lower portion of the second source/drain regions SD2 (i.e., the remaining semiconductor patterns 113) may include the same material as the first lower semiconductor pattern 111, and the second upper semiconductor pattern 122 may include the same material as the first upper semiconductor pattern 121. Further, the first channel region CH1 may include the first lower semiconductor pattern 111 including the same material as the second channel region CH2 and the first upper semiconductor pattern 121 including a different material from the second channel region CH2.

The second transistor TR2 may have a gate-all-around structure. For example, the second channel region CH2 may be provided in the form of a nano wire or a nanotube, whose width ranges from several nanometers to several tens nanometers. Such a structure of the second channel region CH2 may relieve a narrow channel effect in the second transistor TR2.

For the first channel region CH1, a ratio of a side surface area to a total area may be larger than a ratio of a top surface area to the total area. For example, the side surface of the first channel region CH1 may have a lattice plane of (110). For the second channel region CH2, a ratio of an area of top and bottom surfaces to a total area may be large (for example, larger than a ratio of side surface area to the total area). The top and bottom surfaces of the second channel region CH2 may have a lattice plane of (100). According to a carrier type and a lattice orientation, mobility ($\mu$) of carriers may be represented by the following inequalities.

$$\mu_{electron}(100) > \mu_{electron}(111) > \mu_{electron}(110), \text{ and}$$

$$\mu_{hole}(110) > \mu_{hole}(111) > \mu_{hole}(100).$$

Thus in one embodiment, for electrons, the mobility is highest on (100) plane, and, for holes, the mobility is highest on (110) plane. According to still other example embodiments, the first transistor TR1 is the PMOS transistor, in which holes are the majority carrier. In this sense, the first channel region CH1 may allow the first transistor TR1 to have an increased mobility, because a fraction of the side surface having the (110) plane is relatively high in the first channel region CH1. By contrast, the second transistor TR2 is the NMOS transistor, in which electrons are the majority carrier. Accordingly, the second channel region CH2 may allow the second transistor TR2 to have an increased mobility, because a fraction of the top and bottom surfaces having the (100) plane is relatively high in the second channel region CH2, compared with the first channel region CH1.

Figure 19:
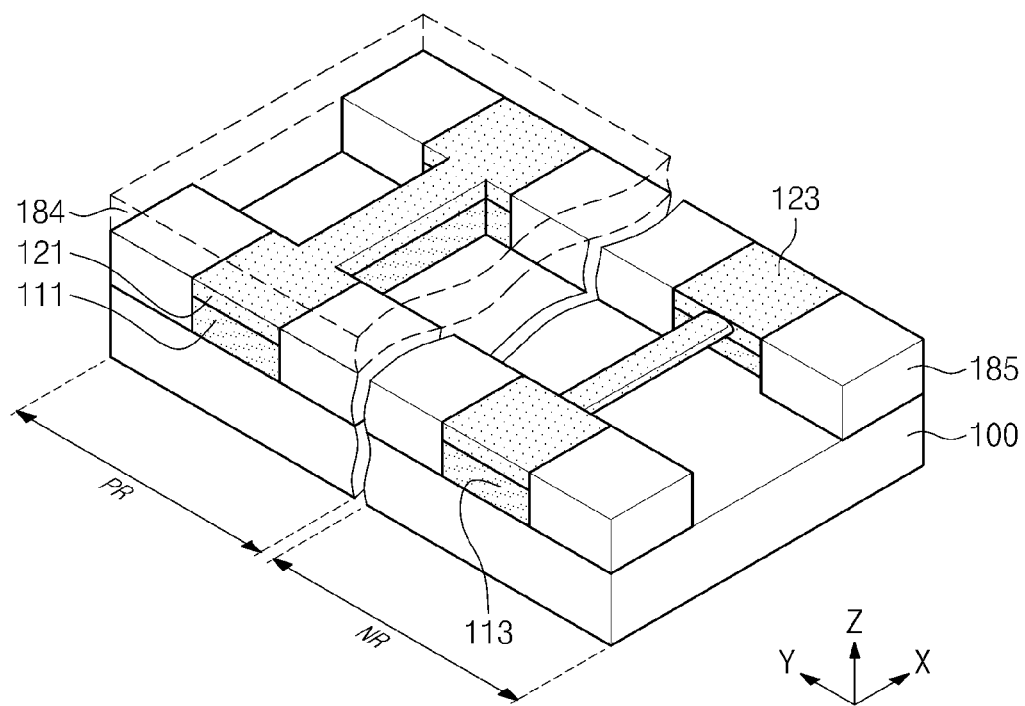
FIG. 19 is a perspective view illustrating a method of fabricating a semiconductor device, according to further example embodiments.
Figure 20A:
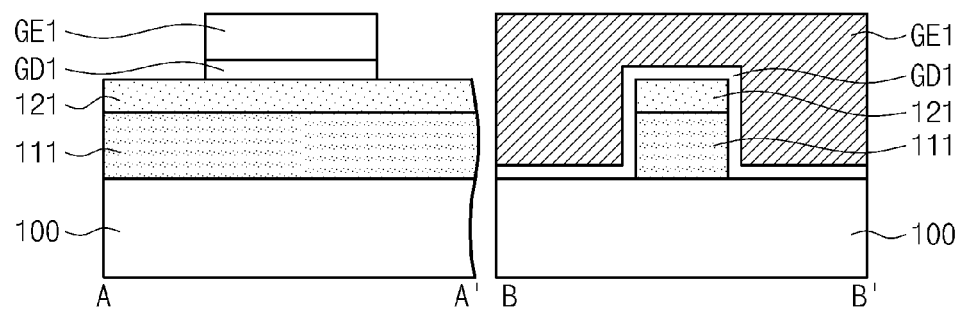
FIG. 20A is an exemplary sectional view taken along lines A-A' and B-B' of FIG. 17.
Figure 20B:
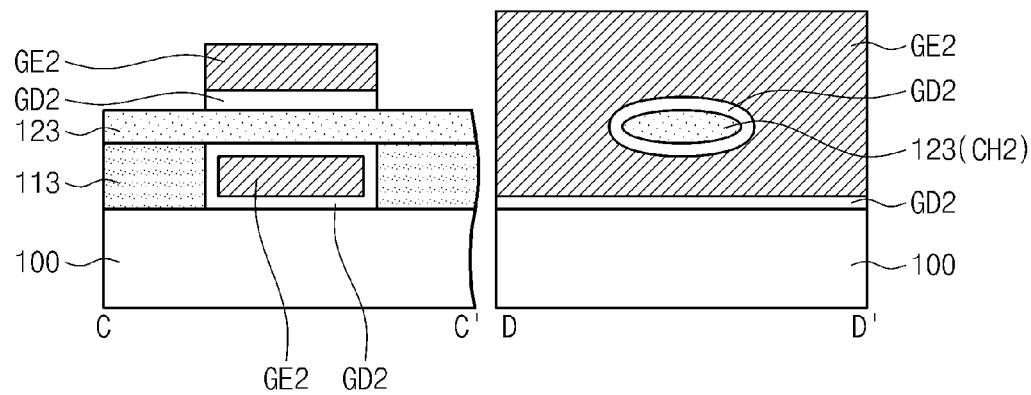
FIG. 20B is an exemplary sectional view taken along lines C-C' and D-D' of FIG. 17.

FIG. 19 is a perspective view illustrating a method of fabricating a semiconductor device, according to further example embodiments. FIGS. 20A and 20B are exemplary sectional views illustrating a semiconductor device according to yet further example embodiments. Here, FIG. 20A is an exemplary sectional view taken along lines A-A' and B-B' of FIG. 17, and FIG. 20B is an exemplary sectional view taken along lines C-C' and D-D' of FIG. 17. For the sake of brevity, again, the elements and features of this example that are similar to those previously shown and described will not be described in much further detail.

Referring to FIGS. 20A and 20B, in a semiconductor device according to further example embodiments, a second transistor TR2 includes a second channel region CH2 having a rounded surface. For example, a section of the second channel region CH2 may be shaped like an ellipse. As shown in FIG. 19, a surface treatment process may be performed to the structure described with reference to FIG. 16 to form a second upper semiconductor pattern 123 having a rounded surface. For example, the surface treatment process may include exposing the structure of FIG. 16 to HCl-containing gas and performing an annealing process under H2 ambient.

Figure 21:
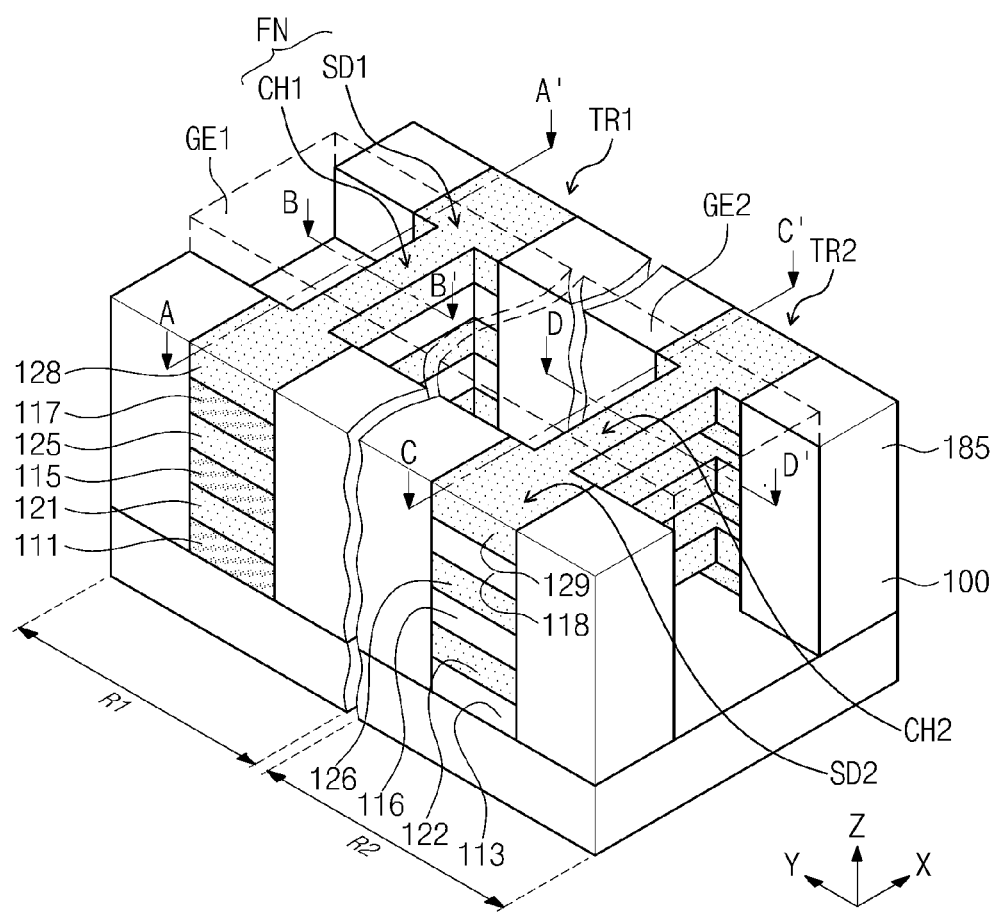
FIG. 21 is a perspective view illustrating a method of fabricating a semiconductor device, according to yet other example embodiments.
Figure 22A:
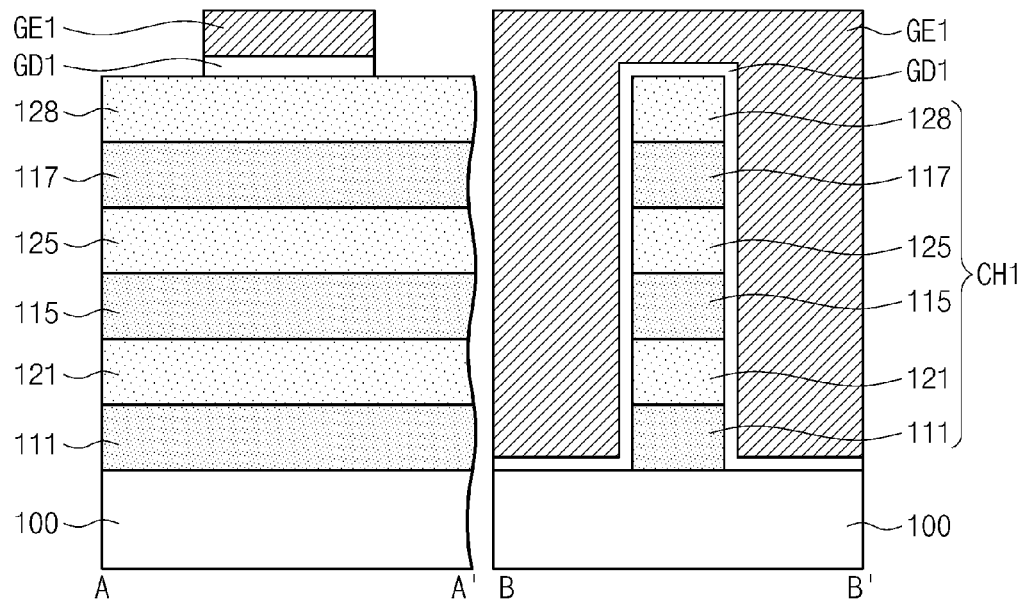
FIG. 22A is an exemplary sectional view taken along lines A-A' and B-B' of FIG. 21.
Figure 22B:
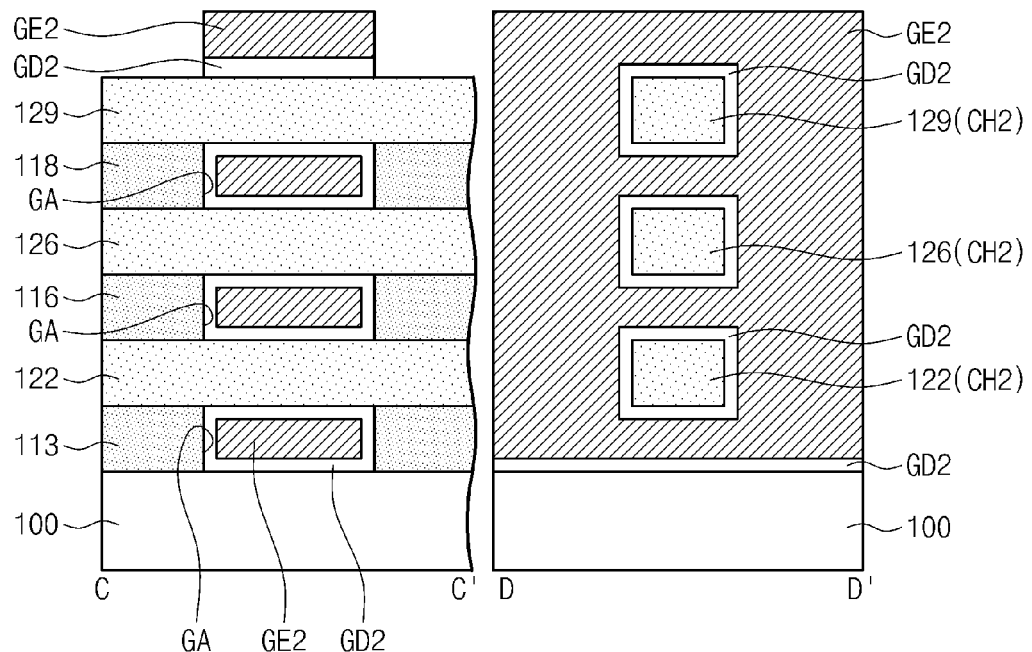
FIG. 22B is an exemplary sectional view taken along lines C-C' and D-D' of FIG. 21.

FIG. 21 is a perspective view illustrating a method of fabricating a semiconductor device, according to yet other example embodiments. FIG. 22A is an exemplary sectional view taken along lines A-A' and B-B' of FIG. 21, and FIG. 22B is an exemplary sectional view taken along lines C-C' and D-D' of FIG. 21. For the sake of brevity, again, the elements and features of this example that are similar to those previously shown and described will not be described in much further detail.

According to yet other example embodiments, a semiconductor device includes first and second transistors TR1 and TR2 provided on first and second regions R1 and R2 of the substrate 100. The substrate 100 may be a semiconductor wafer containing, for example, silicon, germanium, or silicon-germanium. For example, the first region R1 may be a high-voltage region, and the second region R2 may be a low-voltage region. In other example embodiments, the first region R1 may be a PMOSFET region and the second region R2 may be an NMOSFET region.

The first transistor TR1 may include a fin portion FN protruding from the substrate 100 along a z direction. The fin portion FN may include a first channel region CH1 and first source/drain regions SD1 that are spaced apart from each other, in the x direction, by the first channel region CH1. The first channel region CH1 may have a smaller width(in y direction) than the first source/drain regions SD1.

The fin portion FN may include first lower semiconductor patterns 111, 115, and 117 and first upper semiconductor patterns 121, 125, and 128 that are alternatingly and repeatedly stacked on the substrate 100. In order to reduce complexity in the drawings and to provide better understanding of example embodiments, the first lower and upper semiconductor patterns are illustrated to have six alternatingly stacked layers, but example embodiments are not limited thereto. For example, the first lower and upper semiconductor patterns may include four, eight, or more alternatingly stacked layers. Each of pairs of materials, which were described in one of examples 1-11 in the above table 1, may be used for the first lower semiconductor patterns 111, 115, and 117 and the first upper semiconductor patterns 121, 125, and 128. For example, the first lower semiconductor patterns 111,115,117 may include a material having an etch selectivity with respect to the first upper semiconductor patterns 121,125,128.

The first gate dielectric layer GD1 and the first gate electrode GE1 may be sequentially provided on the first channel region CH1. The first gate dielectric layer GD1 and the first gate electrode GE1 may cross the first channel region CH1 and cover the side and top surfaces of the first channel region CH1. The first gate dielectric layer GD1 may include, for example, a silicon oxide layer. In other example embodiments, the first gate dielectric layer GD1 may include a high-k material, whose a dielectric constant is higher than that of the silicon oxide layer. For example, the first gate dielectric layer GD1 may include $HfO_2$, $ZrO_2$, or $Ta_2O_5$. The first gate electrode GE1 may include, for example, at least one of doped silicon, conductive metal nitride, or metal.

The first channel region CH1 may be directly connected to the substrate 100. For example, the first lower semiconductor pattern 111 may have a bottom surface that contacts the top surface of the substrate 100. Accordingly, the channel region of the first transistor TR1 may be electrically connected to the substrate 100 or a body portion of the device. Such a body contact structure may relieve a hot carrier effect, which may occur when the first transistor TR1 is operated.

The second transistor TR2 may include a second channel region CH2 spaced apart from the substrate 100 by the second gate electrode GE2 and the second gate dielectric layer GD2. The second channel region CH2 may include second upper semiconductor patterns 122, 126, and 129. In order to reduce complexity in the drawings and to provide better understanding of example embodiments of the inventive concept, the second upper semiconductor patterns are illustrated to have three layers (e.g., 122, 126, and 129), but example embodiments are not limited thereto. For example, the second upper semiconductor patterns may include two, four or more layers. Gap regions GA may be provided between the second upper semiconductor pattern 122 and the substrate 100 and between the second upper semiconductor patterns 122, 125, and 129. The second gate dielectric layer GD2 and the second gate electrode GE2 may be sequentially provided on the second channel region CH2. The second gate dielectric layer GD2 and the second gate electrode GE2 may extend into the gap regions GA.

The second gate dielectric layer GD2 may include, for example, a silicon oxide layer. In other example embodiments, the second gate dielectric layer GD2 may include a high-k material, whose dielectric constant is higher than that of the silicon oxide layer. For example, the second gate dielectric layer GD2 may include $HfO_2$, $ZrO_2$, or $Ta_2O_5$. The second gate electrode GE2 may include, for example, at least one of doped silicon, conductive metal nitride, or metal.

The second transistor TR2 may include second source/drain regions SD2 that are spaced apart from each other, in the x direction, by the second channel region CH2. The second channel region CH2 may have a smaller width(in y direction) than the second source/drain regions SD2. The second source/drain regions SD2 may be provided in remaining semiconductor patterns 113, 116, and 118 and portions of the second upper semiconductor patterns 122, 126, and 129, which may be alternatingly and repeatedly stacked on the substrate 100. Each of the remaining semiconductor patterns 113, 116, and 118 may be spaced apart from each other by the second gate electrode GE2, in the x direction. Each of pairs of materials, which were described in one of examples 1-11 in the above table 1, may be used for the remaining semiconductor patterns 113, 116, and 118 and the second upper semiconductor patterns 122, 126, and 129. For example, the remaining semiconductor patterns 113, 116, and 118 may include a material having an etch selectivity with respect to the second upper semiconductor patterns 122, 126, and 129.

The second transistor TR2 may have a gate-all-around structure. For example, the second channel region CH2 may be provided in the form of a nano wire or a nanotube having a width ranging from several nanometers to several tens nanometers. Such a structure of the second channel region CH2 may relieve a narrow channel effect in the second transistor TR2.

Since the first transistor TR1 has a plurality of the first lower semiconductor patterns 111, 115,117 and a plurality of the first upper semiconductor patterns 121, 125, and 128, it has an increased fraction of the side surface having the (110) plane and consequently an improved charge mobility. Since the second transistor TR2 has a plurality of the second upper semiconductor patterns 122, 126, and 129, it has an increased fraction of the top and bottom surfaces having the (100) plane and consequently an improved charge mobility. As a result, the first transistor TR1 and the second transistor TR2 can have an improved on-current property.

Figure 23A:
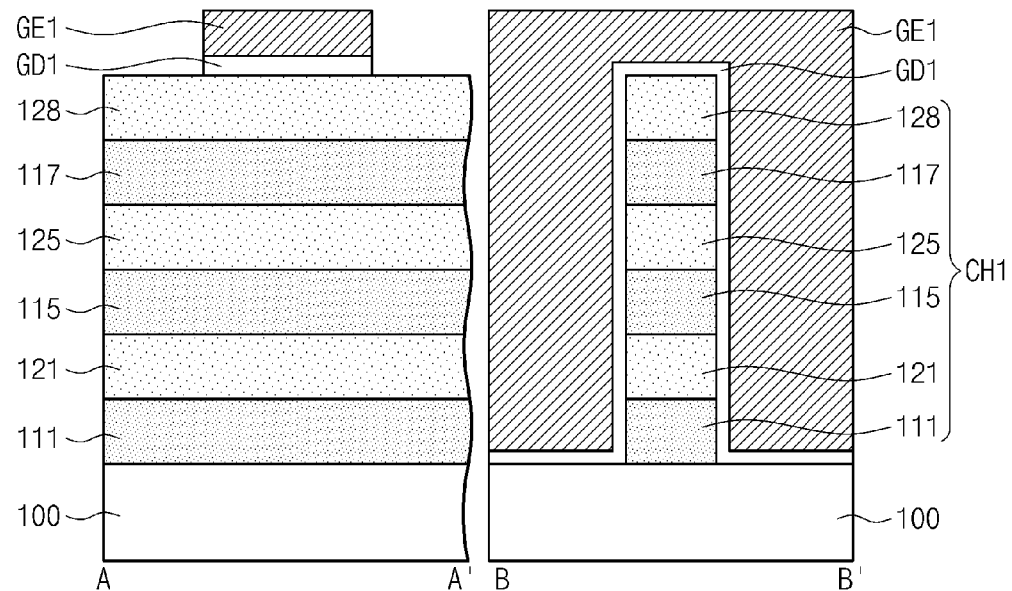
FIG. 23A is an exemplary sectional view taken along lines A-A' and B-B' of FIG. 21.
Figure 23B:
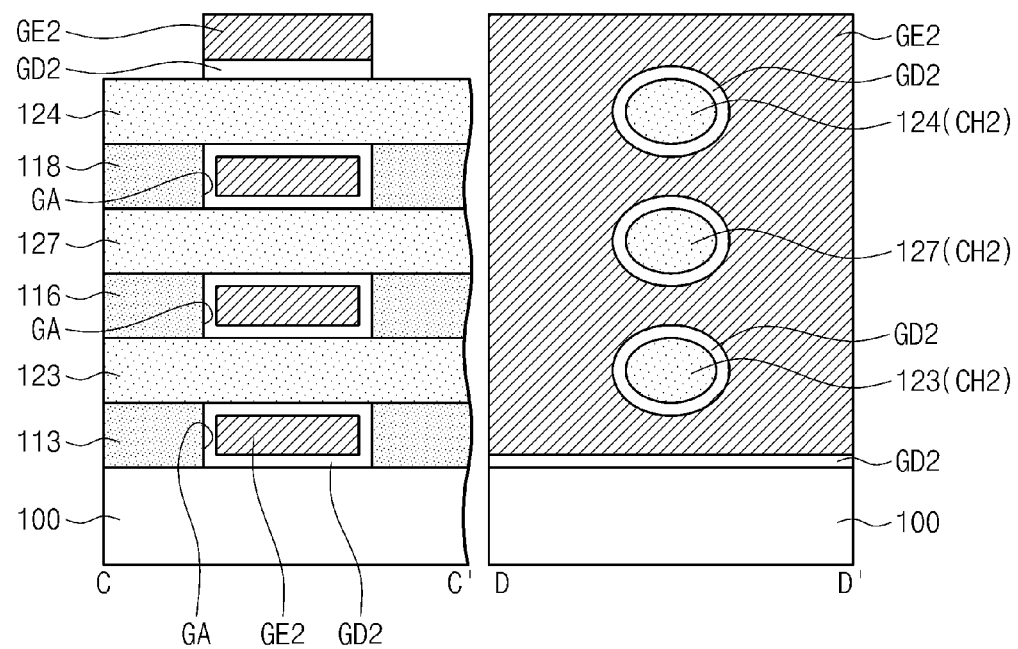
FIG. 23B is an exemplary sectional view taken along lines C-C' and D-D' of FIG. 21.

FIGS. 23A and 23B are sectional views illustrating a semiconductor device according to further example embodiments. Here, FIG. 23A is an exemplary sectional view taken along lines A-A' and B-B' of FIG. 21, and FIG. 23B is an exemplary sectional view taken along lines C-C' and D-D' of FIG. 21. For the sake of brevity, again, the elements and features of this example that are similar to those previously shown and described will not be described in much further detail.

Referring to FIGS. 23A and 23B, in a semiconductor device according to further example embodiments, a second transistor TR2 may include a second channel region CH2 having a rounded surface. The second channel region CH2 may include a plurality of second upper semiconductor patterns 123, 127, and 124. For example, a section of the second channel region CH2 may be shaped like an ellipse. The rounded surface of the second channel region CH2 may be formed by performing a surface treatment process. For example, the surface treatment process may include exposing the structure to HCl-containing gas, and performing an annealing process under H2 ambient.

Figure 27:
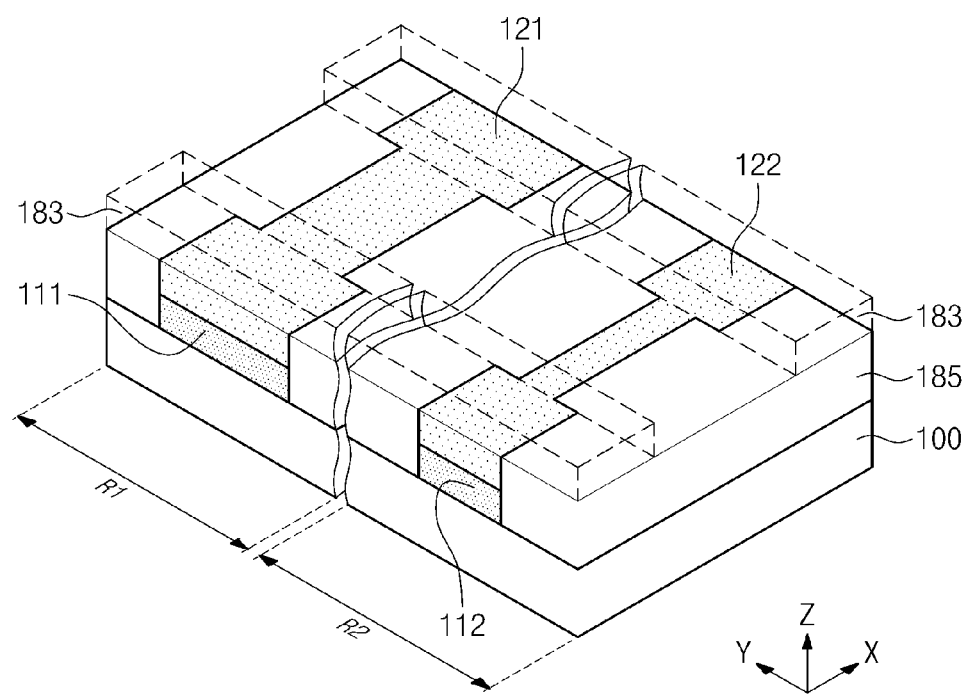
Figure 28:
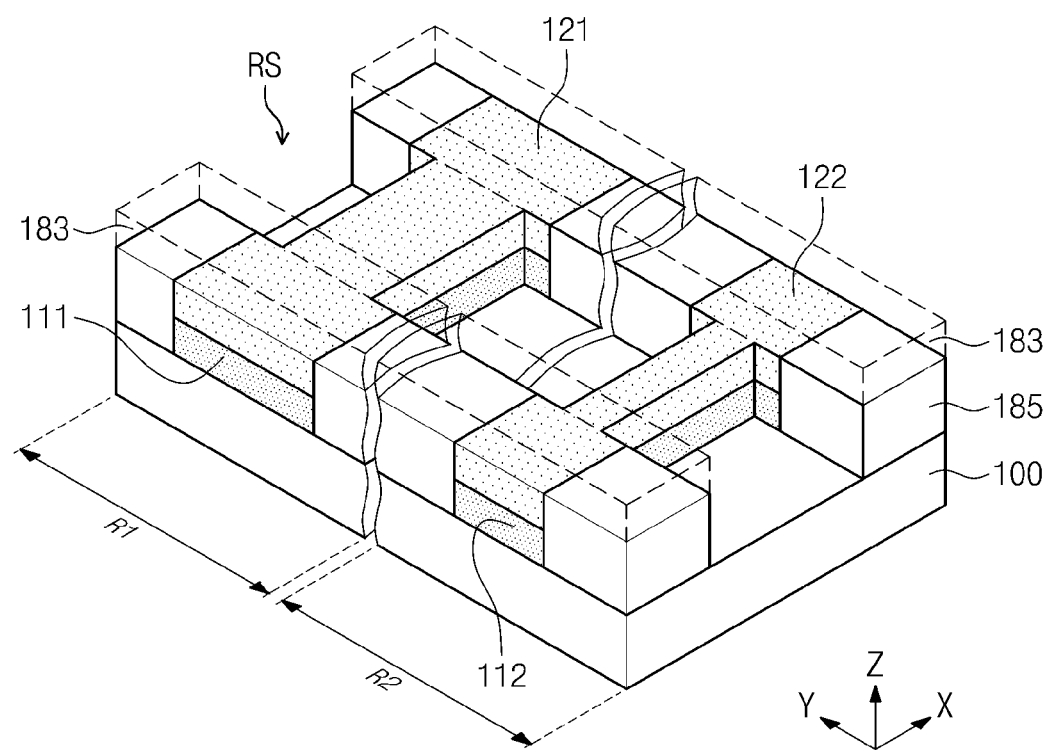
Figure 29:
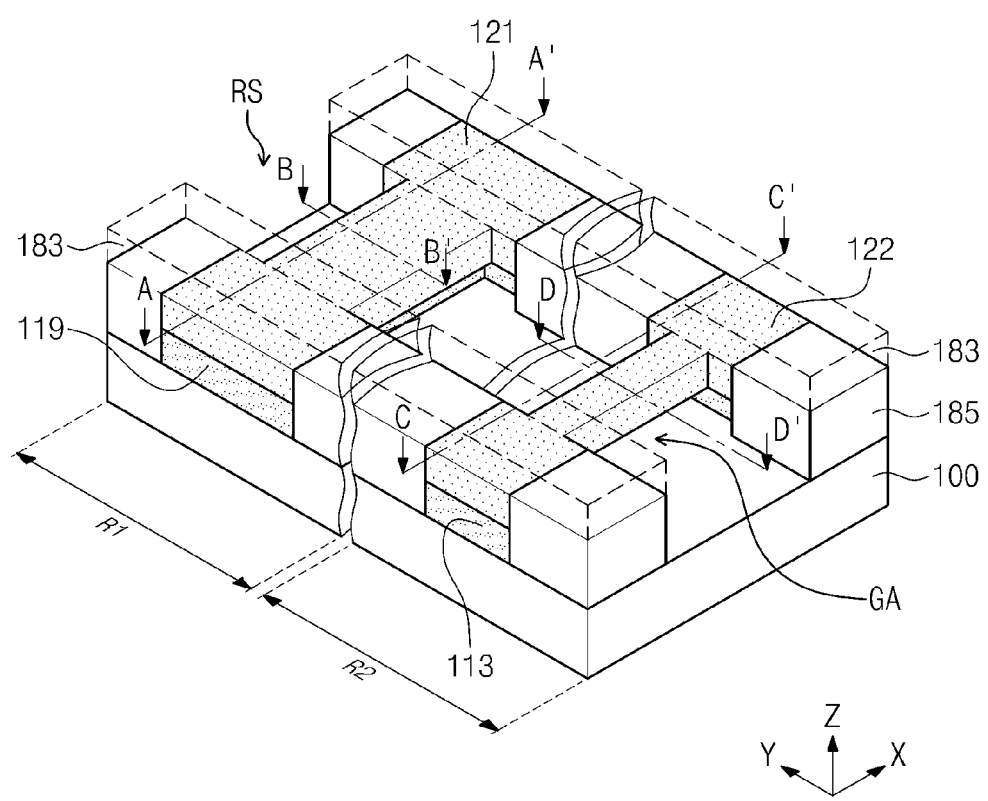
Figure 30A:
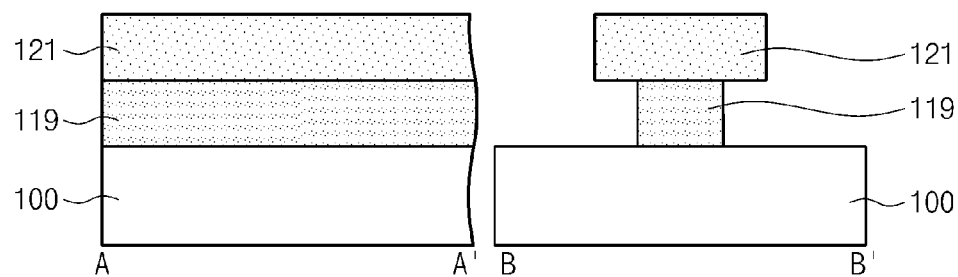
FIG. 30A is an exemplary sectional view taken along lines A-A' and B-B' of FIG. 29
Figure 30B:
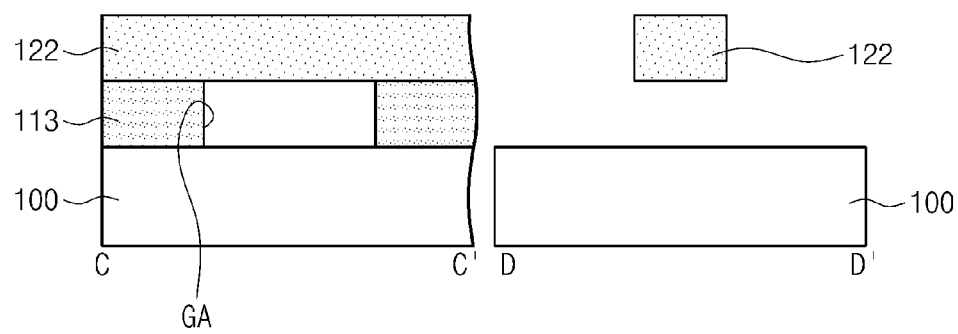
FIG. 30B is an exemplary sectional view taken along lines C-C' and D-D' of FIG. 29.
Figure 31:
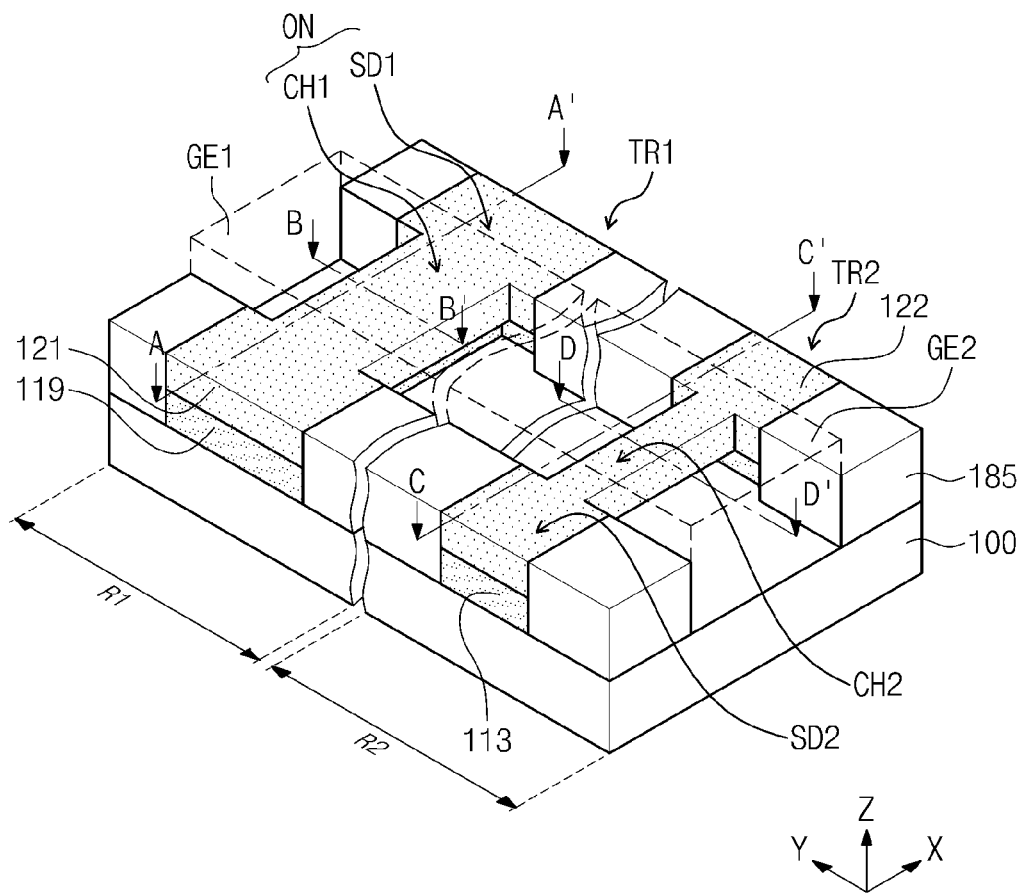
Figure 32A:
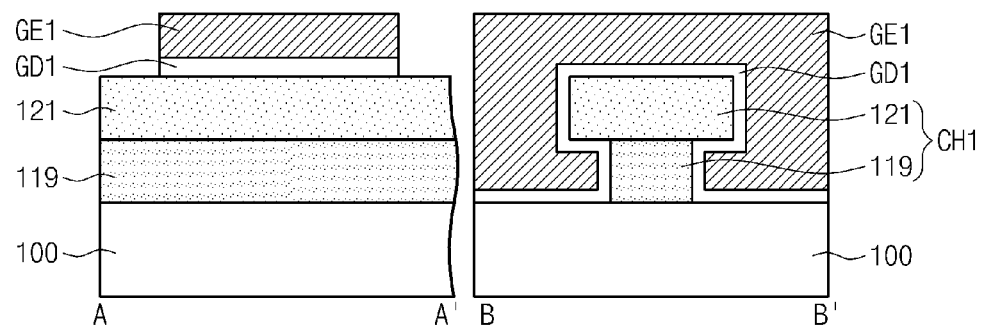
FIG. 32A is an exemplary sectional view taken along lines A-A' and B-B' of FIG. 31
Figure 32B:
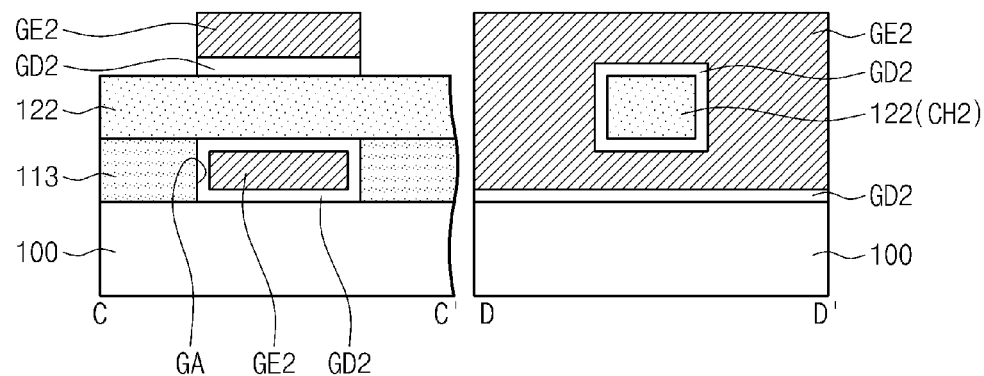
FIG. 32B is an exemplary sectional view taken along lines C-C' and D-D' of FIG. 31.

FIGS. 24 through 29 and FIG. 31 are perspective views illustrating a method of fabricating a semiconductor device, according to still further example embodiments. FIG. 30A is an exemplary sectional view taken along lines A-A' and B-B' of FIG. 29 and FIG. 30B is an exemplary sectional view taken along lines C-C' and D-D' of FIG. 29. FIG. 32A is an exemplary sectional view taken along lines A-A' and B-B' of FIG. 31 and FIG. 32B is an exemplary sectional view taken along lines C-C' and D-D' of FIG. 31.

Figure 24:
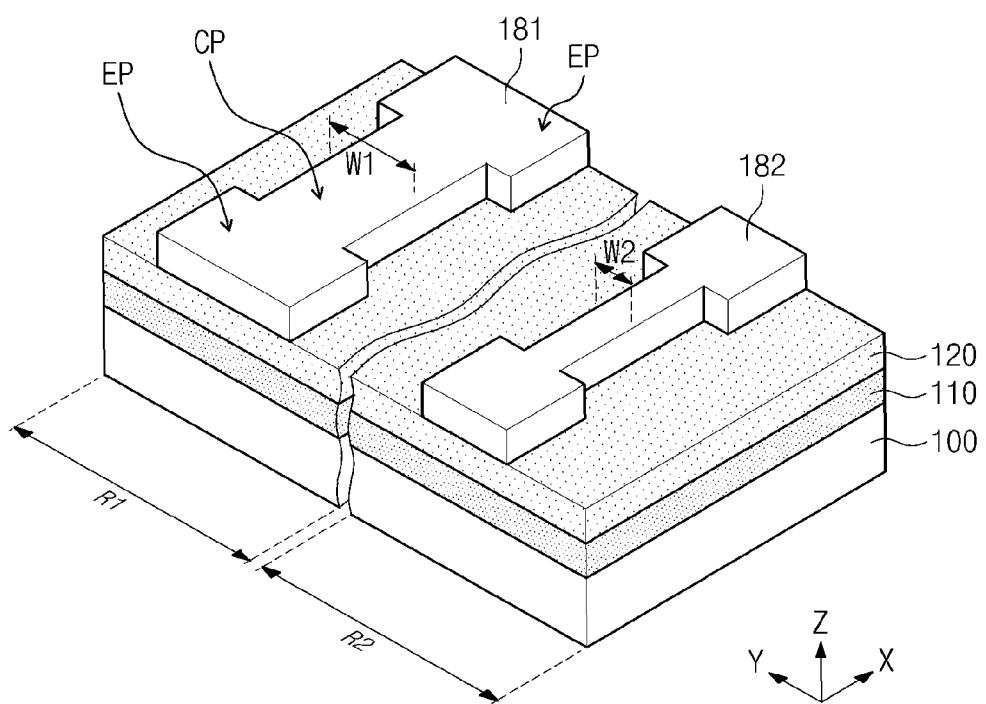
FIGS. 24 through 29 and FIG. 31 are perspective views illustrating a method of fabricating a semiconductor device, according to still further example embodiments.

Referring to FIG. 24, a first semiconductor layer 110 and a second semiconductor layer 120 are sequentially formed on a substrate 100. The substrate 100 includes a first region R1 and a second region R2. In example embodiments, the first region R1 may be a high-voltage transistor region and the second region R2 may be a low-voltage transistor region. In other example embodiments, the first region R1 may be a PMOSFET region and the second region R2 may be an NMOSFET region. The substrate 100 may be a semiconductor wafer containing, for example, silicon, germanium, or silicon-germanium.

In one embodiment, the first semiconductor layer 110 includes a material having an etch selectivity with respect to the second semiconductor layer 120. For example, when the first semiconductor layer 110 is etched using a predetermined etch recipe, the first semiconductor layer 110 may be formed of a material that can be selectively etched, while preventing the second semiconductor layer 120 from being etched. The etch selectivity may be quantitatively expressed in terms of a ratio of an etch rate of the first semiconductor layer 110 to an etch rate of the second semiconductor layer 120. In example embodiments, the first semiconductor layer 110 may be one of materials having an etch selectivity ranging from 10:1 to 200:1, with respect to the second semiconductor layer 120. In other words, the etch rate of the first semiconductor layer 110 is faster than the etch rate of the second semiconductor layer 120. For example, each of pairs of materials, which were described in one of examples 1-11 in the above table 1, may be used for the first and second semiconductor layers 110 and 120.

The first and second semiconductor layers 110 and 120 may be formed, for example, by an epitaxial growth process using the substrate 100 as a seed layer. For example, the epitaxial growth process may be performed by a chemical vapor deposition (CVD) process or a molecular beam epitaxy (MBE) process. The first and second semiconductor layers 110 and 120 may be continuously formed in the chamber. In example embodiments, the first and second semiconductor layers 110 and 120 are grown to cover conformally a whole top surface of the substrate 100. For example, the first and second semiconductor layers 110 and 120 may not be selectively grown from the substrate 100.

First mask patterns 181 and 182 may be formed on the second semiconductor layer 120. The first mask patterns 181 and 182 may be formed in such a way that both end portions EP thereof have a larger width(in y direction) than that of a center portion CP disposed therebetween. Here, the end portions EP may be disposed spaced apart from each other in an x direction. A width W1 of a center portion CP of the first mask pattern 181 on the first region R1 may be greater than a width W2 of a center portion CP of the first mask pattern 182 on the second region R2. The first mask patterns 181 and 182 may include, for example, at least one of photoresist, silicon nitride, silicon oxide, or silicon oxynitride. The first mask patterns 181 and 182 may be formed using, for example, a CVD process.

Figure 25:
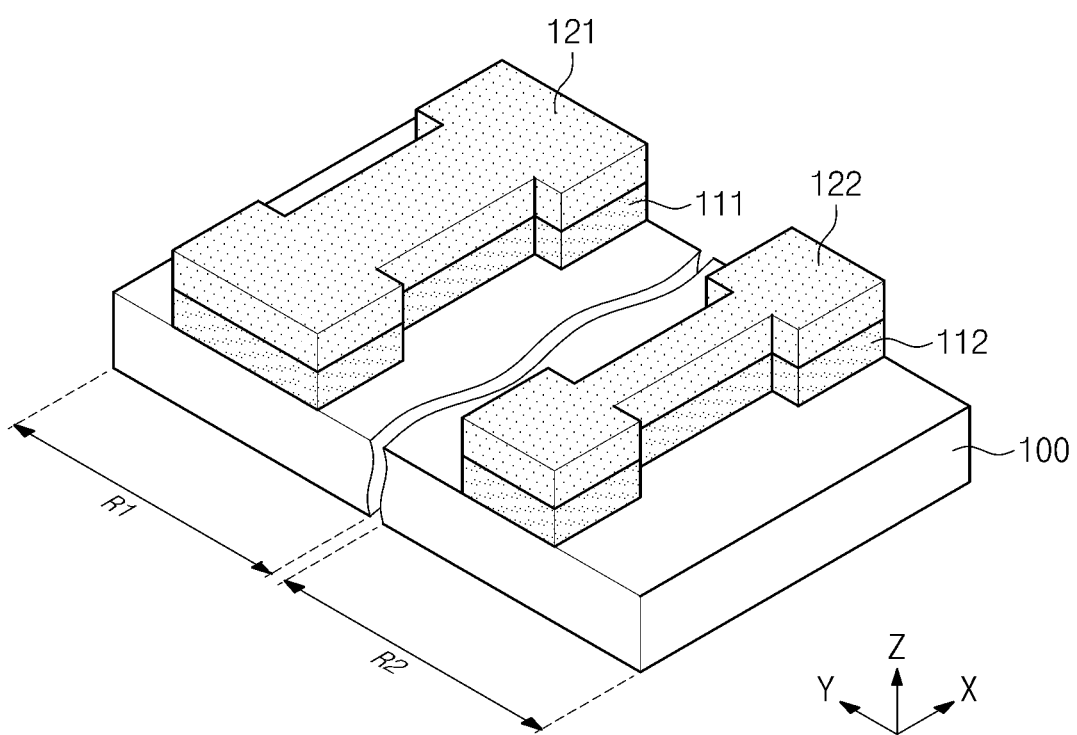

Referring to FIG. 25, a patterning process is performed using the first mask patterns 181 and 182 as an etch mask. Accordingly, a first lower semiconductor pattern 111 and a first upper semiconductor pattern 121 are sequentially stacked on the first region R1, and a second lower semiconductor pattern 112 and a second upper semiconductor pattern 122 are sequentially stacked on the second region R2. Since the first mask pattern 181 on the first region R1 is used as the etch mask, the first lower and upper semiconductor patterns 111 and 121 may be formed in such a way that both end portions thereof have a larger width(in y direction) than that of a center portion thereof, respectively. Similarly, since the first mask pattern 182 on the second region R2 is used as the etch mask, the second lower and upper semiconductor patterns 112 and 122 are formed in such a way that both end portions thereof have a larger width(in y direction) than that of a center portion thereof, respectively. The patterning process may include a dry and/or wet etching process. For example, the patterning process may be performed using an anisotropic dry etching process. After the patterning process, the first mask patterns 181 and 182 are removed. For example, the removal of the first mask patterns 181 and 182 may be performed using an ashing process or a wet etching process.

Figure 26:
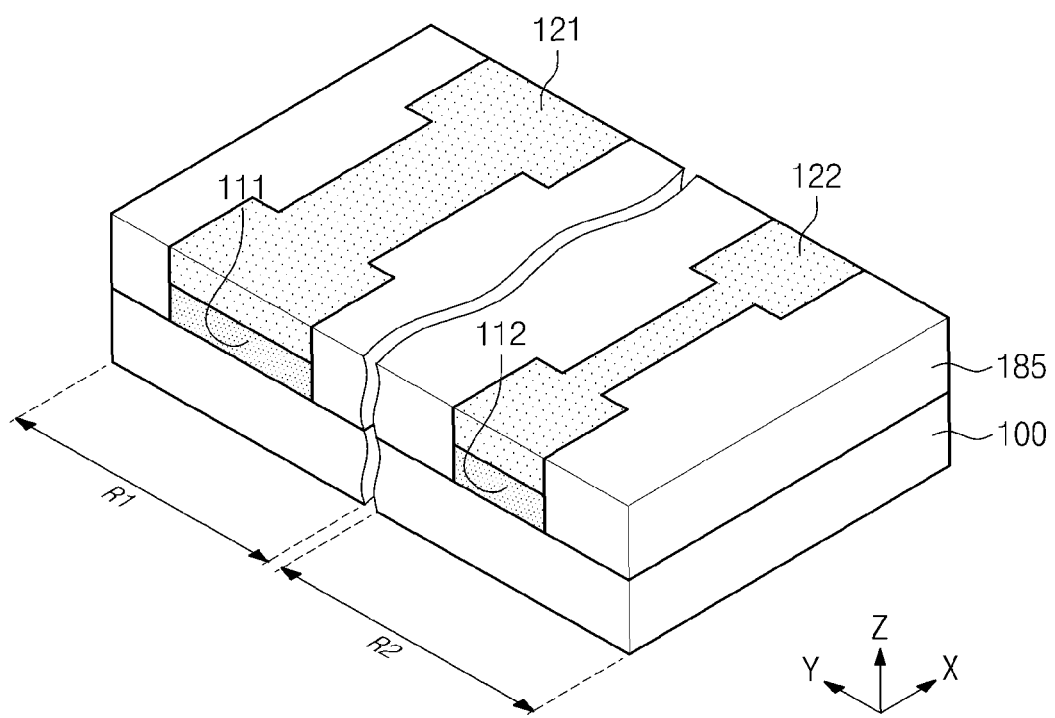

Referring to FIG. 26, an interlayered insulating layer 185 is formed to expose top surfaces of the first and second upper semiconductor patterns 121 and 122. The formation of the interlayered insulating layer 185 may include forming an insulating layer on the substrate 100 using a CVD process, and performing a planarization process to expose the top surfaces of the first and second upper semiconductor patterns 121 and 122. For example, the interlayered insulating layer 185 may include at least one of silicon oxide, silicon nitride, or silicon oxynitride.

Referring to FIG. 27, second mask patterns 183 are formed on the resulting structure with the interlayered insulating layer 185 to cover the end portions of the first and second upper semiconductor patterns 121 and 122. The second mask patterns 183 may be formed to expose the center portions of the first and second upper semiconductor patterns 121 and 122. The second mask patterns 183 may include, for example, at least one of photoresist, silicon oxide, silicon nitride, or silicon oxynitride.

Referring to FIG. 28, a portion of the interlayered insulating layer 185 exposed by the second mask patterns 183 is removed. For example, the removal process may be performed by a dry and/or wet etching process, in which the second mask patterns 183 are used as an etch mask. The removal process may be performed using an etch recipe capable of suppressing the first lower and upper semiconductor patterns 111 and 121 and the second lower and upper semiconductor patterns 112 and 122 from being etched and removing the portion of the interlayered insulating layer 185 exposed by the second mask patterns 183. As the result of the partial removal of the interlayered insulating layer 185, a recess region RS is formed between the second mask patterns 183. The recess region RS on the first region R1 may be delimited by sidewalls of the interlayered insulating layer 185, the first lower semiconductor pattern 111, and the first upper semiconductor pattern 121 and the top surface of the substrate 100. The recess region RS on the second region R2 may be delimited by sidewalls of the interlayered insulating layer 185, the second lower semiconductor pattern 112, and the second upper semiconductor pattern 122 and the top surface of the substrate 100. The recess region RS may expose the sidewalls of the first lower and upper semiconductor patterns 111 and 121 on the first region R1, and the sidewalls of the second lower and upper semiconductor patterns 112 and 122 on the second region R2.

Referring to FIGS. 29, 30A, and 30B, the first and second lower semiconductor patterns 111 and 112 on the first and second regions R1 and R2 exposed by the second mask pattern 183 are etched. The etching process may be performed in such a way that the center portion of the second lower semiconductor pattern 112 is wholly removed from a region below the second upper semiconductor pattern 122 and that the center portion of the first lower semiconductor pattern 111 is partially etched to remain below the first upper semiconductor pattern 121. For example, the first lower semiconductor pattern 111 may have a width greater than that of the second lower semiconductor pattern 112, and thus, the first lower semiconductor pattern 111 may not be wholly etched, just when the center portion of the second lower semiconductor pattern 112 is wholly removed, thereby forming a lower pattern 119 remaining the first upper semiconductor pattern 121. The lower pattern 119 may have a width(in y direction) smaller than that of the upper semiconductor pattern 121. By contrast, as the result of the removal of the center portion of the second lower semiconductor pattern 112, a gap region GA extending from the recess region RS may be formed under the second upper semiconductor pattern 122. Further, remaining semiconductor patterns 113, whose sidewall is covered with the interlayered insulating layer 185, may be formed below the second mask pattern 183.

The removing process may be performed using an etch recipe capable of suppressing the first upper semiconductor pattern 121 and the second upper semiconductor pattern 122 from being etched and of selectively removing the first lower semiconductor pattern 111 and the second lower semiconductor pattern 112. For example, in the case where the first upper semiconductor pattern 121 and the second upper semiconductor pattern 122 contain silicon and the first lower semiconductor pattern 111 and the second lower semiconductor pattern 112 contain silicon-germanium, the etching process may be performed using etching solution, in which peracetic acid is contained. The etching solution may further contain hydrofluoric acid (HF) and deionized water. In contrast to the previous embodiments, in the present embodiment, a mask is not used to cover the first region (such as described in connection with FIGS. 6, 16, and 19).

Referring to FIGS. 31, 32A, and 32B, a first gate dielectric layer GD1 and a first gate electrode GE1 may be sequentially formed on the first region R1, and a second gate dielectric layer GD2 and a second gate electrode GE2 may be sequentially formed on the second region R2. The first gate dielectric layer GD1 and the first gate electrode GE1 may be formed to extend along a direction substantially perpendicular to an extending direction of the first upper semiconductor pattern 121 or along a y direction. Similarly, the second gate dielectric layer GD2 and the second gate electrode GE2 may be formed to extend along a direction substantially perpendicular to an extending direction of the second upper semiconductor pattern 122 or the y direction. The first gate electrode GE1 may be formed to cover the center portion of the first upper semiconductor pattern 121 and expose the end portions thereof. Similarly, the second gate electrode GE2 may be formed to cover the center portion of the second upper semiconductor pattern 122 and expose the end portions thereof.

The first and second gate dielectric layers GD1 and GD2 may include, for example, a silicon oxide layer. In other example embodiments, the first and second gate dielectric layers GD1 and GD2 may include a high-k material, whose dielectric constant is higher than that of the silicon oxide layer. For example, the first and second gate dielectric layers GD1 and GD2 may include $HfO_2$, $ZrO_2$, or $Ta_2O_5$. The first and second gate dielectric layers GD1 and GD2 may be formed of the same material, but example embodiments are not limited thereto.

The first and second gate electrodes GE1 and GE2 may include, for example, at least one of doped silicon, conductive metal nitride, or metal. The first and second gate electrodes GE1 and GE2 may be formed of the same material, but example embodiments are not limited thereto. For example, the first and second gate electrodes GE1 and GE2 may have different work-functions from each other.

The first and second gate dielectric layers GD1 and GD2 and the first and second gate electrodes GE1 and GE2 may be formed by sequentially performing deposition and patterning processes. In example embodiments, the deposition process may be performed using a CVD or sputtering process. In other example embodiments, the first and second gate dielectric layers GD1 and GD2 and the first and second gate electrodes GE1 and GE2 may be formed by a replacement process, in which at least one dummy pattern is used. For example, the dummy pattern may be formed to cover the first and second upper semiconductor patterns 121 and 122, and the dummy pattern may be replaced with the first and second gate dielectric layers GD1 and GD2 and the first and second gate electrodes GE1 and GE2. In this case, the formation of the first and second gate electrodes GE1 and GE2 may include a damascene process.

Hereinafter, a semiconductor device according to still further embodiments will be described with reference to FIGS. 31, 32A, and 32B. The semiconductor device includes the first transistor TR1 provided on the first region R1 of the substrate 100 and the second transistor TR2 provided on the second region R2 of the substrate 100. The substrate 100 may be a semiconductor wafer containing, for example, silicon, germanium, or silicon-germanium.

The first transistor TR1 includes a protruding portion ON protruding from the substrate 100 along the z direction. The protruding portion ON may include a first channel region CH1 and first source/drain regions SD1 spaced apart from each other, in the x direction, by the first channel region CH1. The first channel region CH1 may have a width(in y direction) smaller than that of the first source/drain regions SD1.

The protruding portion ON may include a lower pattern 119 and a first upper semiconductor pattern 121 that are sequentially stacked on the substrate 100. For example, the first channel region CH1 may include the lower pattern 119 and the first upper semiconductor pattern 121. Each of pairs of materials, which were described in one of examples 1-11 in the above table 1, may be used for the lower pattern 119 and the first upper semiconductor pattern 121. For example, the lower pattern 119 may include a material having an etch selectivity with respect to the first upper semiconductor pattern 121.

The first gate dielectric layer GD1 and the first gate electrode GE1 may be sequentially provided on the first channel region CH1. The first gate dielectric layer GD1 and the first gate electrode GE1 may extend along the side and top surfaces of the first channel region CH1. The first gate dielectric layer GD1 may include, for example, a silicon oxide layer. In other example embodiments, the first gate dielectric layer GD1 may include a high-k material, whose dielectric constant is greater than that of the silicon oxide layer. For example, the first gate dielectric layer GD1 may include $HfO_2$, $ZrO_2$, or $Ta_2O_5$. The first gate electrode GE1 may include, for example, at least one of doped silicon, conductive metal nitride, or metal.

The first channel region CH1 may be directly connected to the substrate 100. For example, the first lower semiconductor pattern 111 may have a bottom surface that contacts the top surface of the substrate 100. Accordingly, the channel region of the first transistor TR1 may be electrically connected to the substrate 100 or a body portion of the device. Such a body contact structure may relieve a hot carrier effect, which may occur when the first transistor TR1 is operated.

The lower pattern 119 may have a width(in y direction) that is smaller than that of the first upper semiconductor pattern 121. Accordingly, the first gate electrode GE1 may cover a portion of the bottom surface of the first upper semiconductor pattern 121.

The second transistor TR2 may include the second channel region CH2 spaced apart from the substrate 100 by the second gate electrode GE2 and the second gate dielectric layer GD2. The second gate dielectric layer GD2 and the second gate electrode GE2 may be sequentially provided on the second channel region CH2. The second gate dielectric layer GD2 and the second gate electrode GE2 may extend into a gap region GA between the second upper semiconductor pattern 122 and the substrate 100.

The second gate dielectric layer GD2 may include, for example, a silicon oxide layer. In other example embodiments, the second gate dielectric layer GD2 may include a high-k material, whose dielectric constant is higher than that of the silicon oxide layer. For example, the second gate dielectric layer GD2 may include $HfO_2$, $ZrO_2$, or $Ta_2O_5$. The second gate electrode GE2 may include at least one of doped silicon, conductive metal nitride, or metal. In example embodiments, the second gate electrode GE2 may have a different work-function from the first gate electrode GE1.

The second transistor TR2 includes second source/drain regions SD2 that are spaced apart from each other, in the x direction, by the second channel region CH2. The second channel region CH2 may have a smaller width than the second source/drain regions SD2. The second source/drain regions SD2 may include the remaining semiconductor patterns 113 and the second upper semiconductor pattern 122 that are sequentially stacked on the substrate 100. The remaining semiconductor patterns 113 may be spaced apart from each other by the second gate electrode GE2, in the x direction. Each of pairs of materials, which were described in one of examples 1-11 in the above table 1, may be used for the remaining semiconductor patterns 113 and the second upper semiconductor pattern 122. For example, the remaining semiconductor patterns 113 may include a material having an etch selectivity with respect to the second upper semiconductor pattern 122. A lower portion of the second source/drain regions SD2 (i.e., the remaining semiconductor patterns 113) may include the same material as the first lower semiconductor pattern 111, and the second upper semiconductor pattern 122 may include the same material as the first upper semiconductor pattern 121. Further, the first channel region CH1 may include the first lower semiconductor pattern 111 including the same material as the second channel region CH2 and the first upper semiconductor pattern 121 including a different material from the second channel region CH2.

The second transistor TR2 may have a gate-all-around structure. For example, the second channel region CH2 may be provided in the form of a nano wire or a nanotube, whose width ranges from several nanometers to several tens nanometers. Such a structure of the second channel region CH2 may relieve a narrow channel effect in the second transistor TR2.

Figure 33:
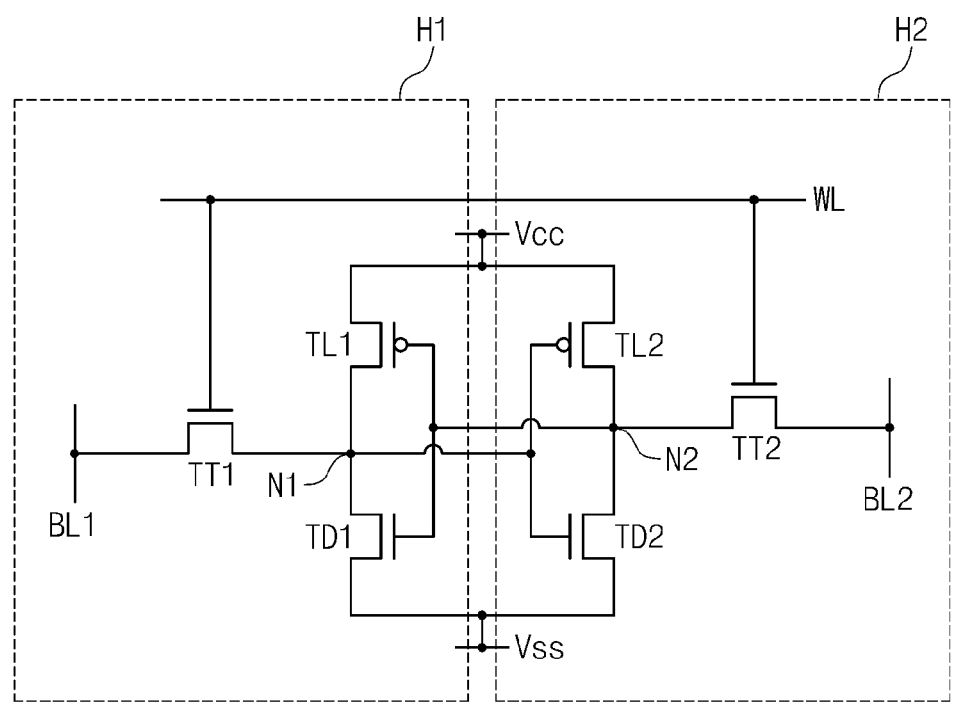
FIG. 33 is an exemplary circuit diagram illustrating a CMOS RAM cell including a semiconductor device according to example embodiments.

FIG. 33 is an exemplary circuit diagram illustrating a CMOS RAM cell including a semiconductor device according to example embodiments. Referring to FIG. 33, the CMOS SRAM cell includes a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be, for example, NMOS transistors, and the load transistors TL1 and TL2 may be, for example, PMOS transistors. In example embodiments, at least one of the driving transistors TD1 and TD2, the transfer transistors TT1 and TT2, and the load transistors TL1 and TL2 are provided in the form of the first transistor TR1 discussed previously, while at least one of the others may be provided in the form of the second transistor TR2 discussed previously.

The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be connected in series to each other. A source region of the second driver transistor TD2 may be electrically connected to the ground line Vss, and a drain region of the second transfer transistor TT2 may be electrically connected to a second bit line BL2.

Source and drain regions of the first load transistor TL1 may be electrically connected to a power line Vcc and a drain region of the first driver transistor TD1, respectively. Source and drain regions of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may serve as a first node N1. The drain region of the second load transistor TL2, the drain region of the second driver transistor TD2, and a source region of the second transfer transistor TT2 may serve as a second node N2. Gate electrodes of the first driver transistor TD1 and the first load transistor TL1 may be electrically connected to the second node N2, and gate electrodes of the second driver transistor TD2 and the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half cell H1, while the second driver transistor TD2, the second transfer transistor TT2, and the second load transistor TL2 may constitute a second half cell H2.

Example embodiments are not limited to the example of SRAM, and may be applied or modified to realize a logic device, DRAM, MRAM, other semiconductor devices, and fabricating methods thereof.

Figure 34:
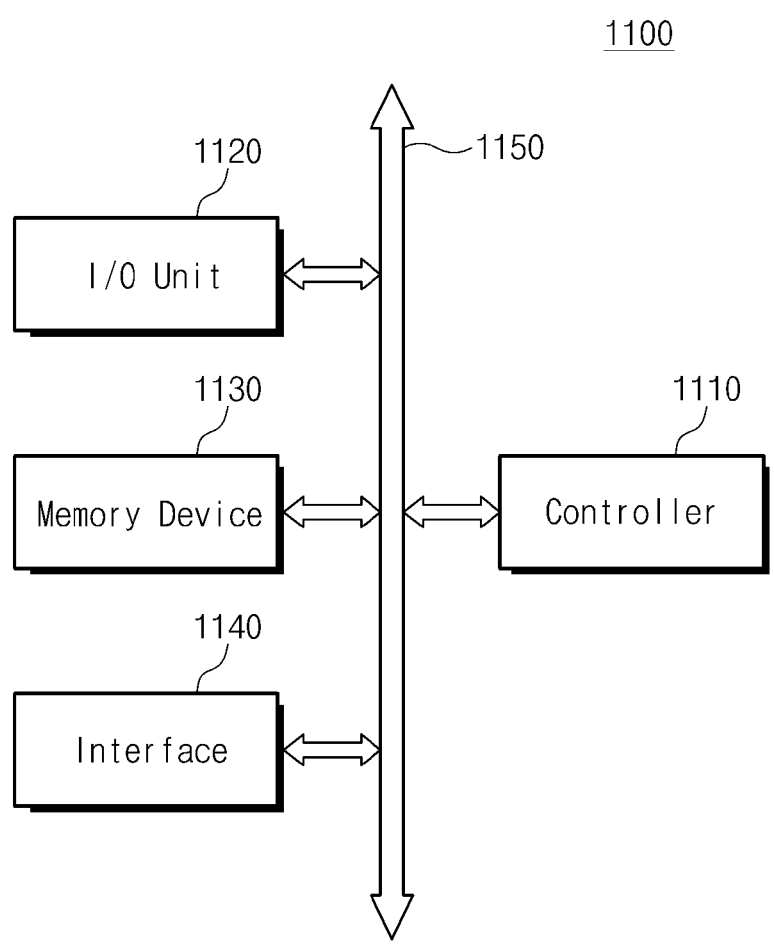
FIG. 34 is a schematic block diagram illustrating an example of an electronic system including a semiconductor device according to example embodiments.

FIG. 34 is a schematic block diagram illustrating an example of electronic systems including a semiconductor device according to example embodiments.

Referring to FIG. 34, an electronic system 1100 may include a controller 1110, an input-output (I/O) unit 1120, a memory device 1130, an interface 1140, and a bus 1150. The controller 1110, the input-output unit 1120, the memory device 1130, and/or the interface 1140 may be connected or coupled to each other via the bus 1150 serving as a pathway for data communication.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110. A semiconductor device according to example embodiments of the inventive concept may be provided in the memory device 1130 or as a part of the controller 1110 and/or the I/O unit 1120.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wireless.

Figure 35:
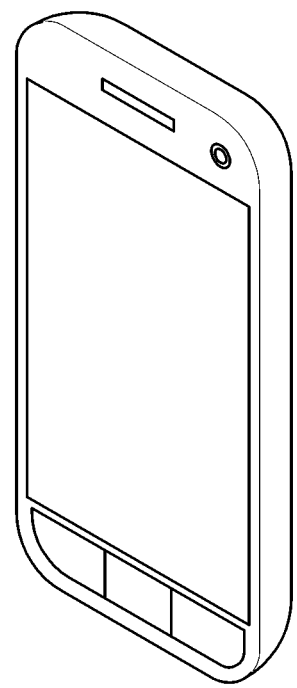
FIG. 35 is a schematic view illustrating a mobile phone, to which an electronic system according to example embodiments can be applied.

FIG. 35 is a schematic view illustrating an example of various electronic devices, to which the electronic system 1100 of FIG. 34 can be applied. As shown in FIG. 35, the electronic system 1100 of FIG. 34 can be applied to realize a mobile phone 800. However, it will be understood that, in other embodiments, the electronic system 1100 of FIG. 34 may be applied to other devices, such as portable notebook computers, MP3 players, navigators, solid state disks (SSDs), automobiles, and/or household appliances.

According to example embodiments, it is possible to form easily and simultaneously a fin-FET and a gate-all-around FET.

Further, it is possible to provide a fin-FET, which is configured to realize a body contact structure, on a high-voltage region and provide a gate-all-around FET, which is configured to suppress a narrow channel effect, on a low-voltage region.

In addition, it is possible to provide a fin-FET, whose channel is parallel to a (110) plane, on a PMOSFET region, and provide a gate-all-around FET, whose channel is parallel to a (100) plane, on an NMOSFET region.

While example embodiments have been particularly shown and described, it will be understood by one of ordinary skill in the art that variations in form and detail may be made therein without departing from the spirit and scope of the attached claims.

What is claimed is:

1. A semiconductor device comprising:
a substrate including a first region and a second region;
a first transistor in the first region and including a first channel region formed of an upper semiconductor layer and a lower semiconductor layer, such that the upper semiconductor layer is formed on the lower semiconductor layer and includes a first material, and the lower semiconductor layer includes a second material different from the first material, the first channel region being a fin structure contacting the substrate and protruding therefrom;
a second transistor in the second region and including a second channel region formed of the upper semiconductor layer and not the lower semiconductor layer or the second material, the second channel region having a gate-all-around structure;
a first gate electrode of the first transistor, the first gate electrode covering the fin structure;
a first gate dielectric layer covering surfaces of the fin structure and formed between the fin structure and the first gate electrode;
a second gate electrode of the second transistor, the second gate electrode formed around the second channel region, such that the second gate electrode covers the second channel region from above, below, and on both sides; and
a second gate dielectric layer covering surfaces of the second channel region and formed between the second channel region and the second gate electrode, the second gate dielectric layer contacting at least a bottom surface of the second channel region.

2. The semiconductor device of claim 1, wherein:
the lower semiconductor pattern comprises a material having an etch selectivity with respect to the upper semiconductor layer.

3. The semiconductor device of claim 1, wherein:
the second channel region has a bottom surface that is substantially coplanar with an interface between the upper and lower semiconductor layers.

4. The semiconductor device of claim 1, wherein:
the first gate structure has a top surface that is substantially coplanar with a top surface of the second gate structure.

5. The semiconductor device of claim 1, further comprising:
first source/drain regions that are spaced apart from each other by the first channel region, each first source/drain region including the lower semiconductor layer and the upper semiconductor layer; and
second source/drain regions that are spaced apart from each other by the second channel region, each second source/drain region including the lower semiconductor layer and the upper semiconductor layer.

6. A semiconductor device, comprising:
a substrate including a first region and a second region;
a first transistor provided on the first region to include a first channel region protruding from the substrate; and
a second transistor provided on the second region to include a second channel region and a gate electrode extending between the substrate and the second channel region,
wherein the first channel region comprises a lower semiconductor pattern containing a different material from the second channel region and an upper semiconductor pattern containing the same material as the second channel region, and
wherein the second transistor further includes a gate dielectric layer contacting top and bottom surfaces of the second channel region, and the top and bottom surfaces of the second channel region contacting the gate dielectric layer are (100) planes.

7. The device of claim 6, wherein the lower semiconductor pattern comprises a material having an etch selectivity with respect to the upper semiconductor pattern.

8. The device of claim 6, wherein the second channel region has a bottom surface that is substantially coplanar with an interface between the upper and lower semiconductor patterns.

9. The device of claim 6, wherein the first transistor is a PMOS transistor and the second transistor is an NMOS transistor.

10. The device of claim 6, wherein the first transistor is a high-voltage transistor having an operation voltage of 1V or higher, and the second transistor is a low-voltage transistor having an operation voltage that is smaller than 1V.

11. The device of claim 10, wherein the lower semiconductor pattern directly contacts a top surface of the substrate.

12. The device of claim 6, wherein the lower semiconductor pattern is part of a plurality of lower semiconductor patterns,
the upper semiconductor pattern is part of a plurality of upper semiconductor patterns, and
the lower semiconductor patterns and the upper semiconductor patterns are alternatingly and repeatedly stacked on top of each other.

13. The device of claim 12, wherein the second channel region is part of a plurality of second channel regions, each of which is coplanar with a corresponding one of the upper semiconductor patterns.

14. The device of claim 6, wherein the lower semiconductor pattern is thicker than the upper semiconductor pattern.

15. A semiconductor device comprising:
a silicon substrate including a first region and a second region;
a first transistor provided on the first region to include a first channel region protruding from the substrate, the first channel region including an upper layer and a lower layer, the lower layer disposed between the substrate and the upper layer; and
a second transistor provided on the second region to include a second channel region and a gate electrode extending between the substrate and the second channel region, the second channel region including the upper layer,
wherein the first channel region comprises a lower semiconductor pattern forming the lower layer and containing a different material not included in the second channel region and an upper semiconductor pattern forming the upper layer and containing the same material as the second channel region, and
wherein at the first transistor, the lower semiconductor pattern has a width smaller than that of the upper semiconductor pattern.

16. The device of claim 6, wherein the second transistor comprises a source region and a drain region that are spaced apart from each other by the second channel region, and
lower portions of the source and drain regions comprise the same material as the lower semiconductor pattern.

17. The device of claim 6, further comprising:
an input/output circuit; and
a logic circuit,
wherein the first transistor is part of the input/output circuit of the semiconductor device, and the second transistor is part of the logic circuit of the semiconductor device.

* * * * *